(12) United States Patent
Qin et al.

(10) Patent No.: US 11,985,845 B2
(45) Date of Patent: May 14, 2024

(54) ENCAPSULATION STRUCTURE, ENCAPSULATION METHOD AND DISPLAY APPARATUS

(71) Applicant: BOE Technology Group Co., Ltd., Beijing (CN)

(72) Inventors: Chengjie Qin, Beijing (CN); Tao Wang, Beijing (CN); Song Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 230 days.

(21) Appl. No.: 16/642,667

(22) PCT Filed: Aug. 16, 2019

(86) PCT No.: PCT/CN2019/101146
§ 371 (c)(1),
(2) Date: Feb. 27, 2020

(87) PCT Pub. No.: WO2020/038301
PCT Pub. Date: Feb. 27, 2020

(65) Prior Publication Data
US 2020/0194725 A1 Jun. 18, 2020

(30) Foreign Application Priority Data
Aug. 22, 2018 (CN) .......................... 201810962401.3

(51) Int. Cl.
*H10K 50/844* (2023.01)
*H10K 71/00* (2023.01)
*H10K 102/00* (2023.01)

(52) U.S. Cl.
CPC ......... *H10K 50/8445* (2023.02); *H10K 71/00* (2023.02); *H10K 2102/311* (2023.02); *H10K 2102/351* (2023.02)

(58) Field of Classification Search
CPC ... H01L 51/5253–5259; H01L 51/5237; H01L 51/5256; H01L 2251/558;
(Continued)

(56) References Cited

U.S. PATENT DOCUMENTS

2003/0164674 A1 9/2003 Imamura
2011/0198620 A1 8/2011 Han et al.
(Continued)

FOREIGN PATENT DOCUMENTS

CN 104576959 A 4/2015
CN 105870355 A 8/2016
(Continued)

OTHER PUBLICATIONS

CN-105977398-B (english translation (2018)).*
(Continued)

*Primary Examiner* — Latanya N Crawford Eason
(74) *Attorney, Agent, or Firm* — Lippes Mathias LLP

(57) ABSTRACT

The present disclosure discloses an encapsulation structure, an encapsulation method and a display apparatus. The encapsulation structure includes at least two encapsulation structure layers that cover an outer side of a device to be encapsulated, at least one of the at least two encapsulation structure layers includes an inorganic layer and an organic layer that are superimposed. The inorganic layer comprises a first sub-inorganic layer and a second sub-inorganic layer that are superimposed, a first opening is in the first sub-inorganic layer, a second opening is in the second sub-inorganic layer, and an elastic structure is disposed in each of the first opening and the second opening.

4 Claims, 15 Drawing Sheets

(58) Field of Classification Search
CPC ............... H10K 50/8445; H10K 71/00; H10K 2102/311; H10K 59/8731; H10K 2102/351
See application file for complete search history.

(56) References Cited

U.S. PATENT DOCUMENTS

| | | | |
|---|---|---|---|
| 2011/0210344 A1 | 9/2011 | Han et al. | |
| 2011/0212304 A1 | 9/2011 | Han et al. | |
| 2012/0256202 A1 | 10/2012 | Lee et al. | |
| 2014/0242354 A1 | 8/2014 | Lee et al. | |
| 2015/0102318 A1* | 4/2015 | Lee ................... | H01L 51/5253 257/40 |
| 2015/0102326 A1* | 4/2015 | An ..................... | H01L 51/56 257/40 |
| 2016/0097124 A1* | 4/2016 | Huh .................. | H01J 37/32899 118/723 R |
| 2016/0322601 A1* | 11/2016 | Lee .................... | H10K 59/12 |
| 2017/0125734 A1 | 5/2017 | Lee et al. | |
| 2017/0256596 A1 | 9/2017 | Hamada et al. | |
| 2018/0006271 A1 | 1/2018 | Tang | |
| 2018/0309088 A1* | 10/2018 | Gong ................. | H10K 71/00 |
| 2019/0036076 A1 | 1/2019 | Tang | |
| 2019/0252641 A1* | 8/2019 | Zhang ............... | H01L 51/524 |

FOREIGN PATENT DOCUMENTS

| | | | |
|---|---|---|---|
| CN | 105938873 A | | 9/2016 |
| CN | 105977398 A | | 9/2016 |
| CN | 106848106 A | | 6/2017 |
| CN | 107170778 A | | 9/2017 |
| CN | 107482127 A | | 12/2017 |
| CN | 105977398 B | * | 1/2018 |
| CN | 109065760 A | | 12/2018 |
| JP | 2011136560 A | | 7/2011 |
| JP | 2011138776 A | | 7/2011 |
| JP | 2011138779 A | | 7/2011 |
| JP | 2012253036 A | | 12/2012 |
| JP | 2017157406 A | | 9/2017 |

OTHER PUBLICATIONS

International search report of PCT application No. PCT/CN2019/101146 dated Nov. 18, 2019.
First office action of Chinese application No. 201810962401.3 dated Sep. 30, 2019.
Extended European search report of counterpart European application No. 19852495.1 dated May 20, 2022.
Greener J et al., Moisture permeability through multilayered barrier films as applied to flexible OLED display,Journal of Applied Polymer Science, John Wiley & Sons, Inc, US, vol. 106, No. 5, Dec. 5, 2007, pp. 3535-3538, figure 3.
Notice of Reasons for Refusal of Japanese application No. 2019-565529 dated Jun. 13, 2023.

* cited by examiner 102  104  104

ENCAPSULATION STRUCTURE, ENCAPSULATION METHOD AND DISPLAY APPARATUS

This application is a 371 of PCT Application No. PCT/CN2019/101146, filed on Aug. 16, 2019, which claims priority to Chinese Patent Application No. 201810962401.3, filed on Aug. 22, 2018 and entitled "Encapsulation Structure, Encapsulation Method and Display Apparatus", the entire contents of which are incorporated herein by reference.

TECHNICAL FIELD

The present disclosure relates to an encapsulation structure, an encapsulation method and a display apparatus.

BACKGROUND

An organic light-emitting diode (OLED) display apparatus is regarded as the most promising display apparatus for its advantages of self-illumination, high contrast, low power consumption, wide viewing angles, flexible display, etc.

SUMMARY

The present disclosure provides an encapsulation structure, an encapsulation method and a display apparatus. The technical solutions are as follows.

In an aspect, an encapsulation structure is provided. The encapsulation structure comprises:

at least two encapsulation structure layers that cover an outer side of a device to be encapsulated, wherein at least one of the at least two encapsulation structure layers comprises an inorganic layer and an organic layer that are superimposed, the inorganic layer comprises a first sub-inorganic layer and a second sub-inorganic layer that are superimposed, a first opening is in the first sub-inorganic layer, a second opening is in the second sub-inorganic layer, and an elastic structure is disposed in each of the first opening and the second opening.

Optionally, an orthographic projection of the second opening on the first sub-inorganic layer and the first opening are staggered.

Optionally, the first opening and the second opening comprise at least one of a hole or a slit.

Optionally, the first opening and the second opening are both slits;

a plurality of the first openings are in the first sub-inorganic layer and extend in parallel directions; and a plurality of the second openings are in the second sub-inorganic layer and extend in parallel directions.

Optionally, the openings in all the sub-inorganic layers of the encapsulation structure extend in parallel directions.

Optionally, each of the first opening and the second opening is curved; or each of the first opening and the second opening is linear.

Optionally, the elastic structure is made from at least one of: polyimide, polyurethane, polypropylene, polydimethylsiloxane (PMDS), polyurethane, polyphenylene sulfide (PPS), hexamethyldisiloxane (HMDSO), tetramethylsilane (TMS) and silica gel.

Optionally, the organic layer is in contact with the inorganic layer, and the elastic structure is made from the same material as the organic layer.

Optionally, in the at least two encapsulation structure layers, an encapsulation structure layer closest to the device to be encapsulated is a first encapsulation structure layer, an encapsulation structure layer farthest from the device to be encapsulated is a second encapsulation structure layer, encapsulation structure layers other than the first encapsulation structure layer and the second encapsulation structure layer are third encapsulation structure layers, the first encapsulation structure layer comprises the inorganic layer and the organic layer that are superimposed, the second encapsulation structure layer comprises the inorganic layer, and the third encapsulation structure layers comprise the inorganic layer and the organic layer that are superimposed.

Optionally, the device to be encapsulated is disposed in a display area of a base substrate; the base substrate is also provided with a non-display area; the encapsulation structure further comprises a barrier wall disposed in the non-display area, orthographic projections of all the organic layers of the encapsulation structure on the base substrate are within the display area, and all the inorganic layers of the encapsulation structure cover the barrier wall.

Optionally, the inorganic layer is made from at least one of: silicon oxynitride, silicon nitride, silicon dioxide, aluminum oxide, zinc oxide and titanium dioxide, and all the inorganic layers of the encapsulation structure are made from the same or different materials; and the organic layer is made from at least one of: polyimide, polyurethane and polypropylene, and all the organic layers of the encapsulation structure are made from the same or different materials.

Optionally, each sub-inorganic layer of the encapsulation structure has a thickness ranging from 0.2 μm to 0.7 μm.

Optionally, the at least two encapsulation structure layers are two encapsulation structure layers.

Optionally, the at least two encapsulation structure layers are two encapsulation structure layers, in the at least two encapsulation structure layers, an encapsulation structure layer closest to the device to be encapsulated is a first encapsulation structure layer, an encapsulation structure layer farthest from the device to be encapsulated is a second encapsulation structure layer, the first encapsulation structure layer comprises the inorganic layer and the organic layer that are superimposed, and the second encapsulation structure layer comprises the inorganic layer;

an orthographic projection of the second opening on the first sub-inorganic layer and the first opening are staggered, the first opening and the second opening comprise at least one of a hole or a slit, when the first opening and the second opening are both slits, the openings in all the sub-inorganic layers of the encapsulation structure extend in parallel directions, and each of the first opening and the second opening is curved or linear;

the device to be encapsulated is disposed in a display area of a base substrate, the base substrate is also provided with a non-display area; the encapsulation structure further comprises a barrier wall disposed in the non-display area, orthographic projections of all the organic layers of the encapsulation structure on the base substrate are within the display area, and all the inorganic layers of the encapsulation structure cover the barrier wall.

In another aspect, an encapsulation method is provided. The method comprises:

forming, on an outer side of a device to be encapsulated, at least two encapsulation structure layers that cover the device to be encapsulated, wherein at least one of the at least two encapsulation structure layers comprises an inorganic layer and an organic layer that are superimposed, the inorganic layer comprises a first sub-inorganic layer and a second sub-inorganic layer that are superimposed, a first opening is in the first sub-inorganic layer, a second opening is in the second sub-inorganic layer, and an elastic structure is disposed in each of the first opening and the second opening.

Optionally, forming, on the outer side of the device to be encapsulated, the at least two encapsulation structure layers that cover the device to be encapsulated comprises:

forming, on the outer side of the device to be encapsulated, an inorganic layer that covers the device to be encapsulated, wherein the inorganic layer comprises a first sub-inorganic layer and a second sub-inorganic layer that are superimposed, a first opening is in the first sub-inorganic layer, a second opening is in the second sub-inorganic layer, an orthographic projection of the second opening on the first sub-inorganic layer and the first opening are staggered, and an elastic structure is disposed in each of the first opening and the second opening;

forming an organic layer on an outer side of the inorganic layer to obtain a first encapsulation structure layer; and Optionally, forming, on the outer side of the device to be encapsulated, the at least two encapsulation structure layers that cover the device to be encapsulated further comprises:

forming, on an outer side of the first encapsulation structure layer, an inorganic layer that covers the first encapsulation structure layer to obtain a second encapsulation structure layer, wherein the inorganic layer comprises a first sub-inorganic layer and a second sub-inorganic layer that are superimposed, a first opening is in the first sub-inorganic layer, a second opening is in the second sub-inorganic layer, an orthographic projection of the second opening on the first sub-inorganic layer and the first opening are staggered, and an elastic structure is disposed in each of the first opening and the second opening.

Optionally, forming, on the outer side of the device to be encapsulated, the inorganic layer that covers the device to be encapsulated comprises:

forming, on the outer side of the device to be encapsulated, a first sub-inorganic layer that covers the device to be encapsulated;
forming a first opening in the first sub-inorganic layer;
forming an elastic structure in the first opening;
forming, on an outer side of the first sub-inorganic layer, a second sub-inorganic layer that covers the first sub-inorganic layer;
forming a second opening in the second sub-inorganic layer; and
forming an elastic structure in the second opening.

Optionally, the device to be encapsulated is disposed in a display area of a base substrate, the base substrate is also provided with a non-display area, and the method further comprises: forming a barrier wall in the non-display area, wherein all the inorganic layers of the encapsulation structure cover the barrier wall.

In yet another aspect, a display apparatus is provided. The display apparatus comprises a display device and an encapsulation structure. The encapsulation structure comprises at least two encapsulation structure layers that cover an outer side of a device to be encapsulated, wherein at least one of the at least two encapsulation structure layers comprises an inorganic layer and an organic layer that are superimposed, the inorganic layer comprises a first sub-inorganic layer and a second sub-inorganic layer that are superimposed, a first opening is in the first sub-inorganic layer, a second opening is in the second sub-inorganic layer, and an elastic structure is disposed in each of the first opening and the second opening.

Optimally, an orthographic projection of the second opening on the first sub-inorganic layer and the first opening are staggered.

Optionally, the first opening and the second opening comprise at least one of a hole or a slit.

Optionally, the first opening and the second opening are both slits;
a plurality of the first openings are in the first sub-inorganic layer and extend in parallel directions; and
a plurality of the second openings are in the second sub-inorganic layer and extend in parallel directions.

Optionally, the openings in all the sub-inorganic layers of the encapsulation structure extend in parallel directions.

Optionally, each of the first opening and the second opening is curved; or
each of the first opening and the second opening is linear.

Optionally, the elastic structure is made from at least one of: polyimide, polyurethane, polypropylene, polydimethylsiloxane (PMDS), polyurethane, polyphenylene sulfide (PPS), hexamethyldisiloxane (HMDSO), tetramethylsilane (TMS) and silica gel.

Optionally, the organic layer is in contact with the inorganic layer, and the elastic structure is made from the same material as the organic layer.

Optionally, in the at least two encapsulation structure layers, an encapsulation structure layer closest to the device to be encapsulated is a first encapsulation structure layer, an encapsulation structure layer farthest from the device to be encapsulated is a second encapsulation structure layer, encapsulation structure layers other than the first encapsulation structure layer and the second encapsulation structure layer are third encapsulation structure layers, the first encapsulation structure layer comprises the inorganic layer and the organic layer that are superimposed, the second encapsulation structure layer comprises the inorganic layer, and the third encapsulation structure layers comprise the inorganic layer and the organic layer that are superimposed.

Optionally, the device to be encapsulated is disposed in a display area of a base substrate; the base substrate is also provided with a non-display area; the encapsulation structure further comprises a barrier wall disposed in the non-display area, orthographic projections of all the organic layers of the encapsulation structure on the base substrate are within the display area, and all the inorganic layers of the encapsulation structure cover the barrier wall.

Optionally, the inorganic layer is made from at least one of: silicon oxynitride, silicon nitride, silicon dioxide, aluminum oxide, zinc oxide and titanium dioxide, and all the inorganic layers of the encapsulation structure are made from the same or different materials; and
the organic layer is made from at least one of: polyimide, polyurethane and polypropylene, and all the organic layers of the encapsulation structure are made from the same or different material s.

Optionally, each sub-inorganic layer of the encapsulation structure has a thickness ranging about from 0.2 μm to 0.7 μm.

Optionally, the at least two encapsulation structure layers are two encapsulation structure layers.

Optionally, the at least two encapsulation structure layers are two encapsulation structure layers, in the at least two encapsulation structure layers, an encapsulation structure layer closest to the device to be encapsulated is a first encapsulation structure layer, an encapsulation structure layer farthest from the device to be encapsulated is a second encapsulation structure layer, the first encapsulation structure layer comprises the inorganic layer and the organic layer that are superimposed, and the second encapsulation structure layer comprises the inorganic layer;

an orthographic projection of the second opening on the first sub-inorganic layer and the first opening are staggered, the first opening and the second opening comprise at least one of a hole or a slit, when the first opening and the second opening are both slits, the openings in all the sub-inorganic layers of the encapsulation structure extend in parallel directions, and each of the first opening and the second opening is curved or linear;

the device to be encapsulated is disposed in a display area of a base substrate, the base substrate is also provided with a non-display area; the encapsulation structure further comprises a barrier wall disposed in the non-display area, orthographic projections of all the organic layers of the encapsulation structure on the base substrate are within the display area, and all the inorganic layers of the encapsulation structure cover the barrier wall.

BRIEF DESCRIPTION OF THE DRAWINGS

In order to describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

The accompanying drawings, which are incorporated in and constitute a part of this specification, illustrate embodiments consistent with the present disclosure and, together with the description, serve to explain the principles of the present disclosure.

DETAILED DESCRIPTION

Embodiments of the present disclosure will be described in further detail with reference to the accompanying drawings, to present the principles, technical solutions, and advantages of the present disclosure more clearly.

An OLED display apparatus includes an OLED device that is easily eroded by such components as moisture and oxygen in the air. Therefore, an encapsulation structure is usually used to encapsulate the OLED device. A traditional encapsulation structure includes an inorganic layer and an organic layer that are sequentially superimposed on an outer side of the OLED device in a covering manner. The inorganic layer has certain ability to obstruct water and oxygen, and thus can isolate the OLED device from the outside air. The organic layer has certain bendability, and thus can realize flexible display of the OLED display apparatus. However, after the OLED device is encapsulated by the traditional encapsulation structure, the inorganic layer is easily broken in the bending process when the OLED display apparatus performs flexible display. As a result, the stretchability and the bending resistance of the encapsulation structure are relatively poor.

Figure 1:
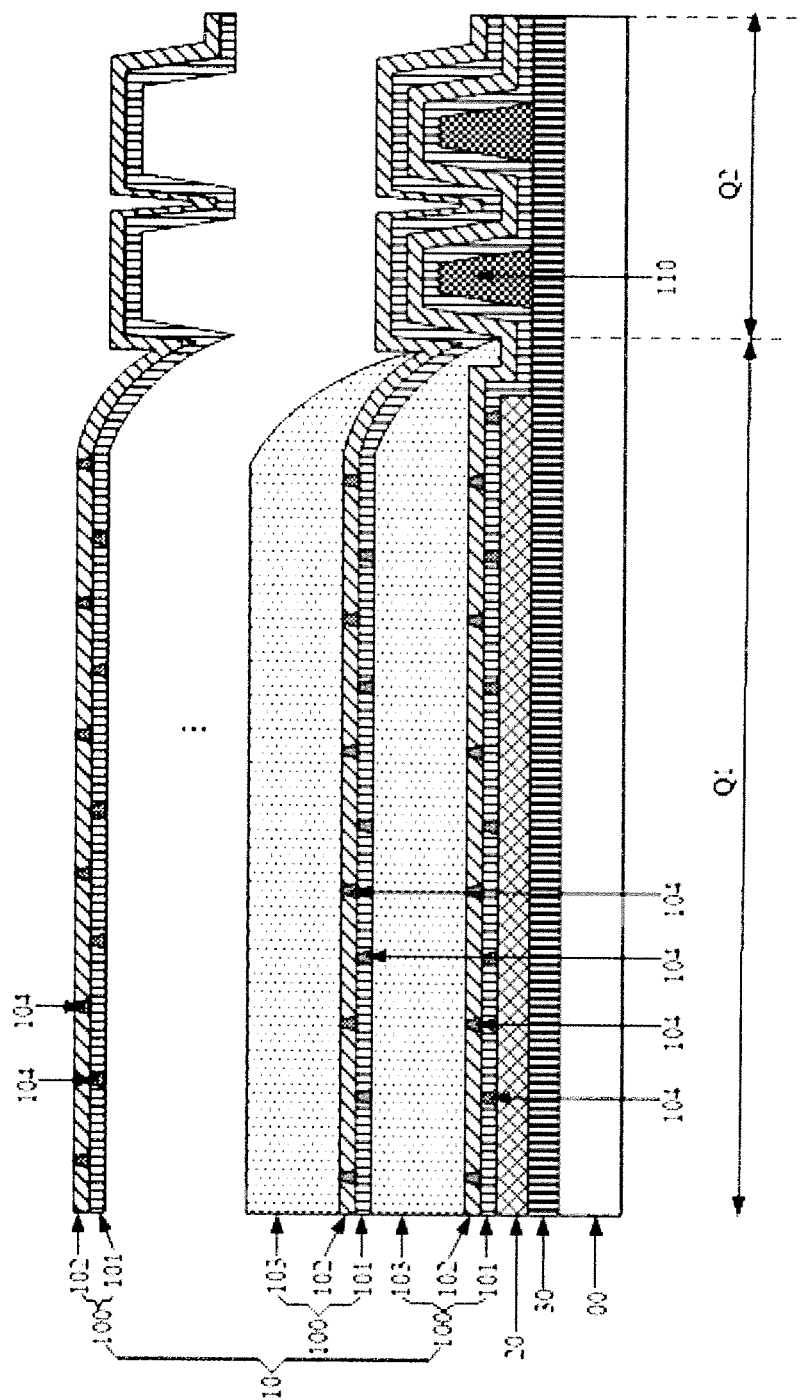
FIG. 1 is a schematic diagram showing an application of an encapsulation structure accordance with an embodiment of the present disclosure.

Please refer to FIG. 1, which is a schematic diagram showing an application of an encapsulation structure 10 in accordance with an embodiment of the present disclosure. Referring to FIG. 1, the encapsulation structure 10 includes at least two encapsulation structure layers 100 that cover an outer side of a device to be encapsulated 20. At least one of the at least two encapsulation structure layers 100 includes an inorganic layer (not shown in FIG. 1) and an organic layer 103 that are superimposed. The inorganic layer comprises a first sub-inorganic layer 101 and a second sub-inorganic layer 102 that are superimposed. A first opening is in the first sub-inorganic layer 101, a second opening is in the second sub-inorganic layer 102, and an elastic structure 104 is disposed in each of the first opening and the second opening.

In summary, in the encapsulation structure provided in the embodiments of the present disclosure, at least one encapsulation structure layer includes the inorganic layer and the organic layer that are superimposed. The inorganic layer comprises a first sub-inorganic layer and a second sub-inorganic layer that are superimposed, a first opening is in the first sub-inorganic layer, a second opening is in the second sub-inorganic layer, and an elastic structure is disposed in each of the first opening and the second opening. Each elastic structure can improve the stretchability and the bending resistance of the inorganic layer in which the elastic structure is, and thus the stretchability and the bending resistance of the inorganic layers are improved, which is helpful to improve the stretchability and the bending resistance of the encapsulation structure.

Optionally, as shown in FIG. 1, the orthographic projection of the second opening on the first sub-inorganic layer 101 and the first opening are staggered, such that the elastic structure 104 in the second opening on the first sub-inorganic layer 101 and the first opening are staggered. In the encapsulation structure provided in the embodiments of the present disclosure, since the orthographic projection of the second opening on the first sub-inorganic layer 101 and the first opening are staggered, the first sub-inorganic layer 101 and the second sub-inorganic layer 102 can be sealed by each other to prevent such components as moisture and oxygen in the air from entering the encapsulation structure 10 through the first opening and/or the second opening to erode the device to be encapsulated. Therefore, the encapsulation structure 10 provided in the embodiments of the present disclosure helps obstruct such components as moisture and oxygen in the air to guarantee an encapsulation effect.

Optionally, as shown in FIG. 1, the inorganic layer and the organic layer 103 are superimposed in a direction away from the device to be encapsulated 20, and the first sub-inorganic layer 101 and the second sub-inorganic layer 102 are also superimposed in a direction away from the device to be encapsulated 20. That is, in the encapsulation structure layer 100, the first sub-inorganic layer 101, the second sub-inorganic layer 102 and the organic layer 103 are sequentially superimposed in the direction away from the device to be encapsulated 20.

Optionally, in the at least two encapsulation structure layers 100 of the encapsulation structure 10, the encapsulation structure layer closest to the device to be encapsulated 20 is a first encapsulation structure layer (that is, the encapsulation structure layer in contact with the device to be encapsulated 20 is a first encapsulation structure layer), the encapsulation structure layer farthest from the device to be encapsulated 20 is a second encapsulation structure layer, and encapsulation structure layers other than the first encapsulation structure layer and the second encapsulation structure layer are third encapsulation structure layers. The first encapsulation structure layer includes an inorganic layer and an organic layer 103 that are superimposed in a direction away from the device to be encapsulated 20. The inorganic layer includes a first sub-inorganic layer 101 and a second sub-inorganic layer 102 that are superimposed in a direction away from the device to be encapsulated 20. In the first encapsulation structure layer, a first opening is in the first sub-inorganic layer 101, a second opening is in the second sub-inorganic layer 102, an orthographic projection of the second opening on the first sub-inorganic layer 101 and the first opening are staggered, and an elastic structure 104 is disposed in each of the first opening and the second opening. The second. encapsulation structure layer includes an inorganic layer. The inorganic layer includes a first sub-inorganic layer 101 and a second sub-inorganic layer 102 that are superimposed in a direction away from the device to be encapsulated 20. In the second encapsulation structure layer, a first opening is in the first sub-inorganic layer 101, a second opening is in the second sub-inorganic layer 102, an orthographic projection of the second opening on the first sub-inorganic layer 101 and the first opening are staggered, and an elastic structure 104 is disposed in each of the first opening and the second opening. The third encapsulation structure layer includes an inorganic layer and an organic layer 103 that are superimposed in a direction away from the device to be encapsulated 20. The inorganic layer includes a first sub-inorganic layer 101 and a second sub-inorganic layer 102 that are superimposed in a direction away from the device to be encapsulated 20. In the third encapsulation structure layer, a first opening is in the first sub-inorganic layer 101, a second opening is in the second sub-inorganic layer 102, an orthographic projection of the second opening on the first sub-inorganic layer 101 and the first opening are staggered, and an elastic structure 104 is disposed in each of the first opening and the second opening.

Figure 2:
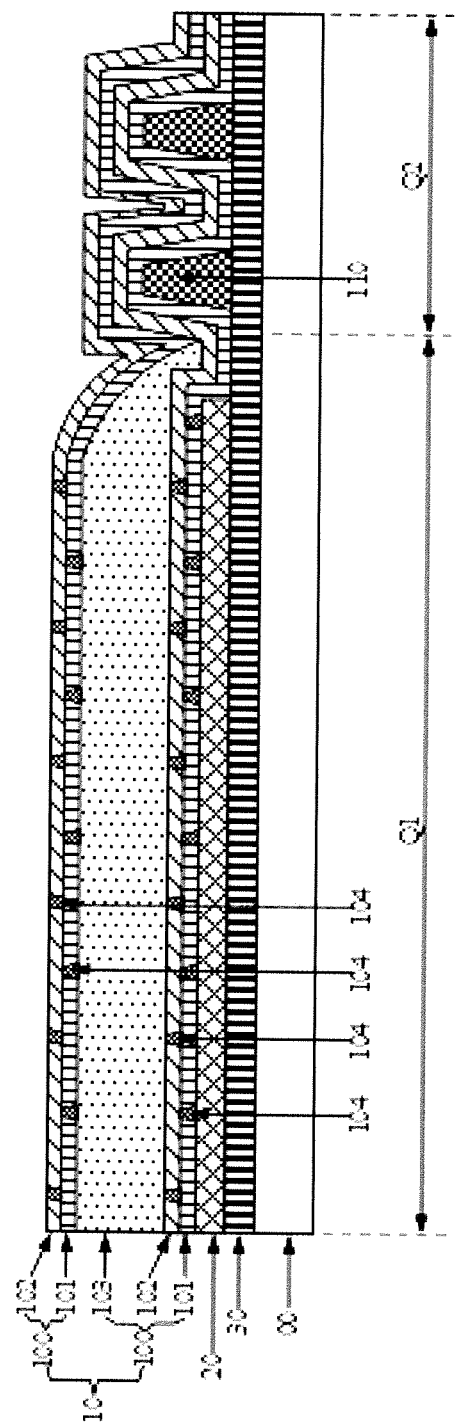
FIG. 2 is a schematic diagram showing an application of another encapsulation structure in accordance with an embodiment of the present disclosure.

It is easy to understand that the number of the third encapsulation structure layer is at least 1 when the encapsulation structure 10 includes at least three encapsulation structure layers 100, and the encapsulation structure 10 does not include the third encapsulation structure layer when the encapsulation structure 10 includes two encapsulation structure layers 100. Exemplarily, the number of the third encapsulation structure layer is 1 when the encapsulation structure 10 includes three encapsulation structure layers 100, and the number of the third encapsulation structure layer is 0 when the encapsulation structure 10 includes two encapsulation structure layers 100. Optionally, please refer to FIG. 2, which is a schematic diagram showing an application of another encapsulation structure 10 in accordance with an embodiment of the present disclosure. Referring to FIG. 2, the encapsulation structure 10 includes two encapsulation structure layers 100, namely, a first encapsulation structure layer and a second encapsulation structure layer, and does not include a third encapsulation structure layer.

It can be known from the above description, FIG. 1 and FIG. 2 that each sub-inorganic layer of the encapsulation structure 10 has an opening, and an elastic structure 104 is disposed in each opening. In this way, each sub-inorganic layer of the encapsulation structure 10 has excellent stretchability and bending resistance. Thus, each inorganic layer of the encapsulation structure 10 has favorable stretchability and bending resistance. Hence, the encapsulation structure 10 has favorable extensibility and bending resistance.

Figure 3:
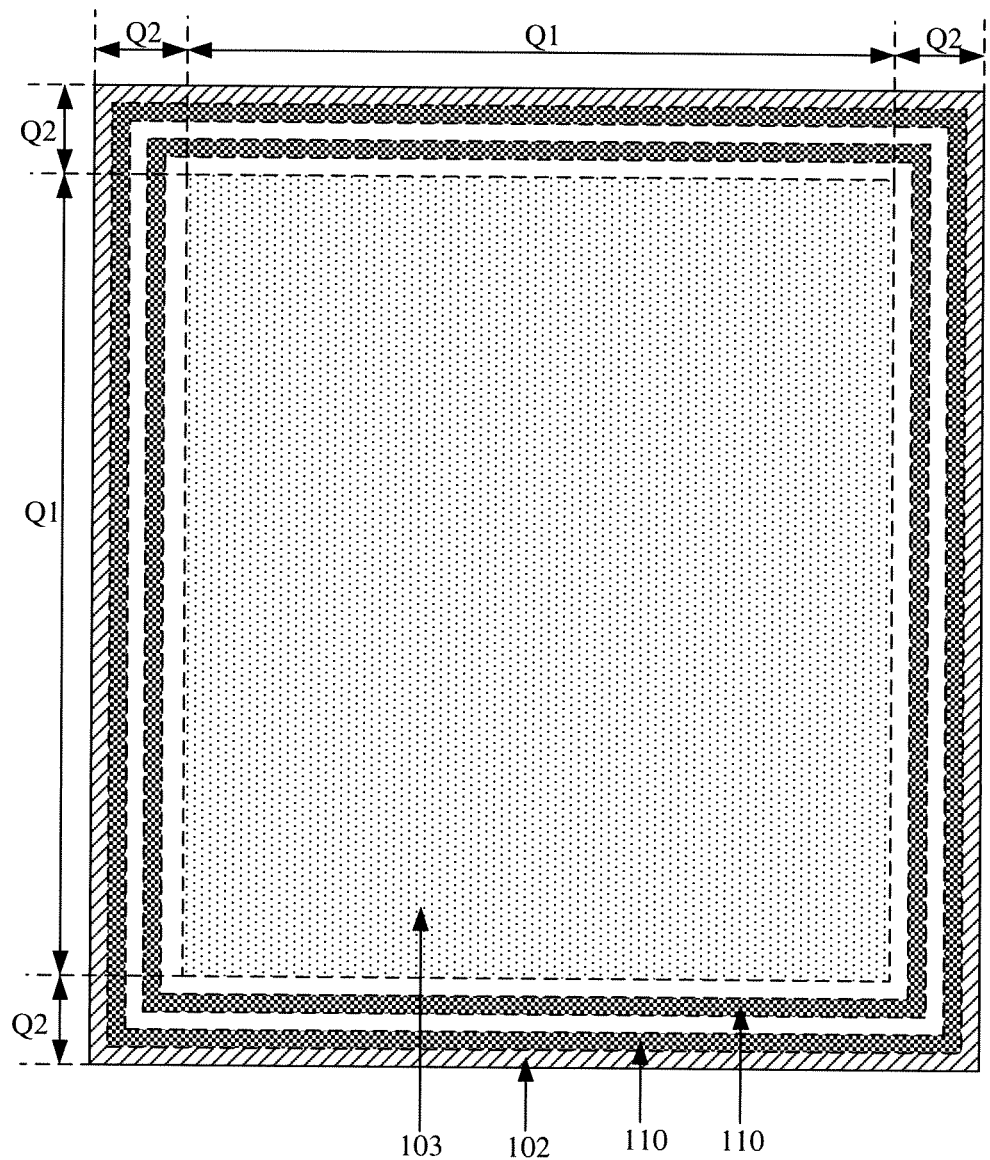
FIG. 3 is a top view of FIG. 1 or FIG. 2.

Optionally, as shown in FIG. 1 and FIG. 2, the device to be encapsulated 20 is disposed in a display area Q1 of a base substrate 00, and the base substrate 00 is further provided with a non-display area Q2. The encapsulation structure 10 further includes a barrier wall 110 disposed in the non-display area. Q2. Orthographic projections of all the organic layers 103 of the encapsulation structure 10 on the base substrate 00 are located in the display area Q1. All the inorganic layers of the encapsulation structure 10 fully cover the barrier wall 110. Exemplarily, as shown in FIG. 2, the first sub-inorganic layer 101 and the second sub-inorganic layer 102 of each inorganic layer cover the barrier wall 110. The barrier wall 110 may be a barrier wall obstructing such components as moisture and oxygen, and may be made from an organic material. The number and the widths of the barrier walls 110 may be determined according to the width of the non-display area Q2 of the base substrate 00. As shown in FIGS. 1 and 2, the number of the barrier walls 110 is 2. It is easy to understand that FIG. 1 and FIG. 2 are merely exemplary, the display area. Q1 of the base substrate 00 is generally in the center of the base substrate 00, and the non-display area Q2 of the base substrate 00 surrounds the display area. Q1 and is distributed at the periphery of the base substrate 00. The barrier walls 110 are disposed in the non-display area Q2. Therefore, the barrier walls 110 surround the display area Q1. Exemplarily, please refer to FIG. 3, which is a top view of FIG. 1 or FIG. 2. With reference to FIG. 3 and in combination with FIG. 1 and FIG. 2, the non-display area Q2 surrounds the display area Q1 and is distributed at the periphery of the base substrate 00. Two barrier walls 110 are both disposed in the non-display area Q2, and each barrier wall 110 surrounds the display area Q1. The orthographic projection of the organic layer 103 on the base substrate 00 is within the display area Q1 and the second inorganic layer 102 covers the barrier wall 110. Here, in order to clearly illustrate the relationships among orthographic projections of the second inorganic layer 102, the organic layer 103 and the barrier wall 110. FIG. 3 does not illustrate the device to be encapsulated and other structures, and the edge of the organic layer 103 and the edge of the barrier wall 110 are drawn with dotted lines in FIG. 3. The dotted lines indicate that the organic layer 103 and the barrier wall 110 are both under the second inorganic layer 102 and are fully covered by the second inorganic layer 102.

It is easy to understand that such components as moisture and oxygen in the air usually enter the encapsulation structure from the side of the encapsulation structure through film gaps of the encapsulation structure. In the embodiments of the present disclosure, the barrier wall 110 can obstruct such components as moisture and oxygen that enter from the side of the encapsulation structure 10, such that an erosion path along which such components as moisture and oxygen reach the device to be encapsulated 20 is extended. Thus, the service life of the device to be encapsulated 20 is prolonged.

Optionally, as shown in FIG. 1 and FIG. 2, the base substrate 00 is also provided with a thin film transistor (TFT) layer 30. The device to be encapsulated 20 and the barrier wall 110 are both disposed on the TFT layer 30 and on the side, away from the base substrate 00, of the TFT layer 30. The TFT layer 30 may include a plurality of TFTs (not shown in FIG. 1 or 2). The device to be encapsulated 20 may be a display device, for example, an OLED device or a quantum dot light emitting diodes (QLED) device. The OLED device includes an anode, a hole transport layer, an electro luminescence (EL) layer, an electron transport layer, a cathode, etc. The EL layer is also called an organic light-emitting layer, which is easily eroded by such components as moisture and oxygen in the air. Therefore, isolating the OLED device from the outside air by the encapsulation structure 10 is essentially isolating the organic light-emitting layer from the outside air. The base substrate 00 may be a transparent substrate, which may be a rigid substrate made from a non-metallic light-transmitting material with certain ruggedness, such as glass, quartz or transparent resin. Alternatively, the base substrate 00 may be a flexible substrate made from polyimide (PI). A flexible base may be disposed on the base substrate 00 when the base substrate 00 is a rigid substrate, and the TFT layer 30 may be disposed on the flexible base. The base substrate 00 can be stripped off after the encapsulation structure 10 is formed, and flexible display of the display device is facilitated.

Optionally, in the embodiments of the present disclosure, each sub-inorganic layer of the encapsulation structure 10 has a thickness ranging about from 0.2 μm to 0.7 μm. In this way, stress in the sub-inorganic layer is reduced on the premise of guaranteeing the encapsulation effect of the sub-inorganic layer. Thus, the stress in the inorganic layer is reduced to facilitate bending of the inorganic layer. In the embodiments of the present disclosure, the thickness of the sub-inorganic layer ranging about from 0.2 μm to 0.7 μm may refer to that the value range of the thickness of the sub-inorganic layer may fluctuate by 20% percent) on the basis of the range of 0.2 μm to 0.7 μm. Optionally, the value range of the thickness of the sub-inorganic layer may be (0.2±0.2×20%) μm to (0.7±0.7×20%) μm. That is, the value range of the thickness of the sub-inorganic layer may be (0.2±0.04) μm to (0.7±0.14) μm. Exemplarily, the thickness of the sub-inorganic layer may range from 0.16 μm to 0.56 μm, or from 02.4 μm to 0.84 μm, or from 0.16 82 m to 0.84 μm or from 0.24 μm to 0.56 μm.

Optionally, each inorganic layer of the encapsulation structure 10 may be made from at least one of the following materials: silicon oxynitride (SiON), silicon nitride (SiNx), silicon dioxide ($SiO_2$), aluminum oxide ($Al_2O_3$), zinc oxide (ZnO) and titanium dioxide ($TiO_2$). All the inorganic layers of the encapsulation structure 10 may be made from the same or different materials. Exemplarily, the first sub-inorganic layer 101 and the second sub-inorganic layer 102 are made from the same or different materials. Each organic layer 103 of the encapsulation structure 10 may be made from at least one of the following materials: polyimide, polyurethane (PU) and polypropylene. All the organic layers of the encapsulation structure 10 may be made from the same or different materials. The elastic structure 104 may be made from at least one of the following materials: polyimide, polyurethane, polypropylene, polydimethylsiloxane (PMDS), polyurethane, polyphenylene sulfide (PPS), hexamethyldisiloxane (HMDSO), tetramethylsilane (TMS) and silica gel. The elastic structure 104 in the first opening and the elastic structure 104 in the second opening may be made from the same or different materials. The elastic structures 104 in different first openings may be made from the same or different materials, and the elastic structures 104 in different second openings may be made from the same or different materials. Optionally, as shown in FIGS. 1 and 2, the organic layer 103 is in contact with the inorganic layer, and the elastic structure 104 in the opening of the inorganic layer is made from the same material as that of the organic layer 103. For example, the elastic structure 104 in the second opening of the second inorganic layer 102 is made from the same material as that of the organic layer 103.

Optionally, in the embodiments of the present disclosure, the shape of the elastic structure 104 in the first opening matches that of the first opening, and the shape of the elastic structure 104 in the second opening matches that of the second opening. That is, the shape of each elastic structure 104 matches that of the opening where the elastic structure 104 is disposed, such that each elastic structure 104 can be filled into the corresponding opening, and each elastic structure 104 can be in contact with the side of the corresponding opening to ensure that the sub-inorganic layer is an integral film layer.

Optionally, the first opening and the second opening may include at least one of a hole or a slit. For example, the first opening is a hole and the second opening is a slit; or, the first opening is a slit and the second opening is a hole; or, the first opening and the second opening are both holes; or the first opening and the second opening are both slits. The hole may be a through hole or a blind hole, and may be a circular hole, a square hole, or an arbitrary polygonal hole. In the embodiments of the present disclosure, the hole refers to an opening of which the opening surface is shaped like a closed graph, and the slit refers to an opening of which the opening surface is shaped like a semi-closed or open graph. The opening surface of the hole is generally smaller than that of the slit. Compared with the opening surface of the hole, the opening surface of the slit usually has a certain length, which is not limited in the embodiments of the present disclosure.

Optionally, the first opening and the second opening are both slits. A plurality of first openings are formed in each first sub-inorganic layer 101 and extend in parallel directions, and a plurality of second openings are formed in each second sub-inorganic layer 102 and extend in parallel directions. Optionally, the openings in all the sub-inorganic layers of the encapsulation structure 10 extend in parallel directions, and orthographic projections of the openings in all the sub-inorganic layers of the encapsulation structure 10 on the base substrate 00 are staggered. Staggering of the orthographic projections means that there is no overlapping area among the orthographic projections.

Optionally, the first opening and the second opening are both slits, each of the first opening and the second opening may be in the shape of a curve, and the curve may be a smooth curve or a broken line. Alternatively, each of the first opening and the second opening may be linear, and when the opening is linear, there may be an angle between the opening and the boundary of the sub-inorganic layer where the opening is located. The angle is usually less than or equal to 90°. For example, the angle may be 45°, 60°, 30°, or the like.

Figure 4:
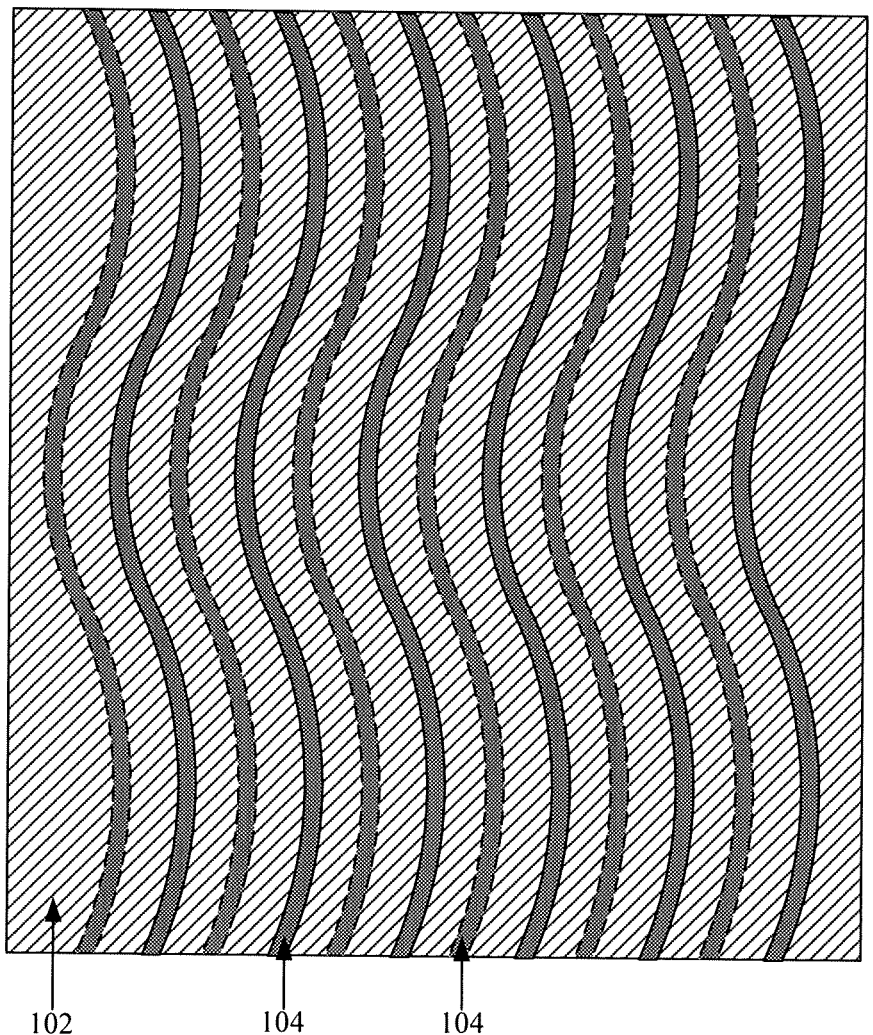
FIG. 4 is a front view of an encapsulation structure in accordance with an embodiment of the present disclosure.
Figure 5:
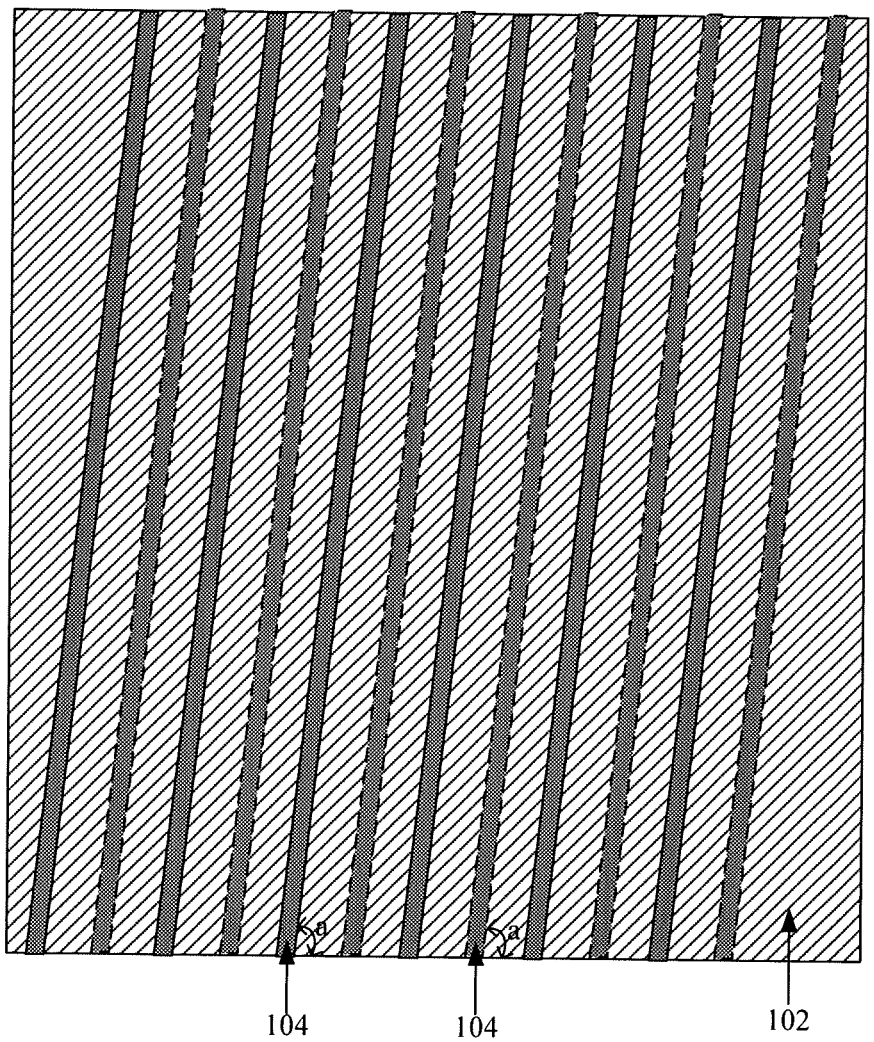
FIG. 5 is a front view of another encapsulation structure in accordance with an embodiment of the present disclosure.

Exemplarily, please refer to FIGS. 4 and 5, which are front views of two encapsulation structures 10 in accordance with the embodiments of the present disclosure. In FIGS. 4 and 5, the opening indicated by the dotted line is a first opening (namely, the opening in the first sub-inorganic layer 101), and the opening indicated by the solid line is a second opening (namely, the opening in the second sub-inorganic layer 102). For explanation, FIG. 4 and FIG. 5 take that the first opening and the second opening are both slits as an example, FIG. 4 takes that the first opening and the second opening are curved as an example, and FIG. 5 takes that the first opening and the second opening are linear as an example. As shown in FIG. 4, a plurality of first openings are formed in the first sub-inorganic layer (not shown in FIG. 4) of the second encapsulation structure layer and an elastic structure 104 is disposed in each first opening. The plurality of first openings extend in parallel directions. A plurality of second openings are formed in the second sub-inorganic layer 102 of the second encapsulation structure layer and an elastic structure 104 is disposed in each second opening. The plurality of second openings extend in parallel directions. Optionally, the first openings and the second openings extend in parallel directions. As shown in FIG. 5, a plurality of first openings are formed in the first sub-inorganic layer (not shown in FIG. 5) of the second encapsulation structure layer and an elastic structure 104 is disposed in each first opening. The plurality of first openings are parallel to one another. A plurality of second openings are formed in the second sub-inorganic layer 102 of the second encapsulation structure layer and an elastic structure 104 is disposed in each second opening. The plurality of second openings are parallel to one another. Optionally, the first openings and the second openings are parallel to each other. There is an angle a between each first opening and the boundary (the boundary of the first sub-inorganic layer and the boundary of the second sub-inorganic layer 102 in FIG. 5 may coincide) of the first sub-inorganic layer, there is an angle a between each second opening and the boundary of the second sub-inorganic layer 102, and the angle a is less than 90°.

It is easy to understand that FIG. 4 and FIG. 5 are described by taking that the first opening and the second opening are both slits as an example. The first opening and the second opening may also be holes. When the first opening and the second opening are both holes, the plurality of first openings in the first sub-inorganic layer may be arranged in an array into curves or straight lines, and the plurality of second openings in the second sub-inorganic layer 102 may be arranged in an array into curves or straight lines. Optionally, the plurality of first openings and the plurality of second openings may also be arranged in other shapes, or, the plurality of first openings may be uniformly arranged in the first sub-inorganic layer, and the plurality of second openings may be uniformly arranged in the second sub-inorganic layer, which is not limited in the embodiments of the present disclosure.

Figure 6:
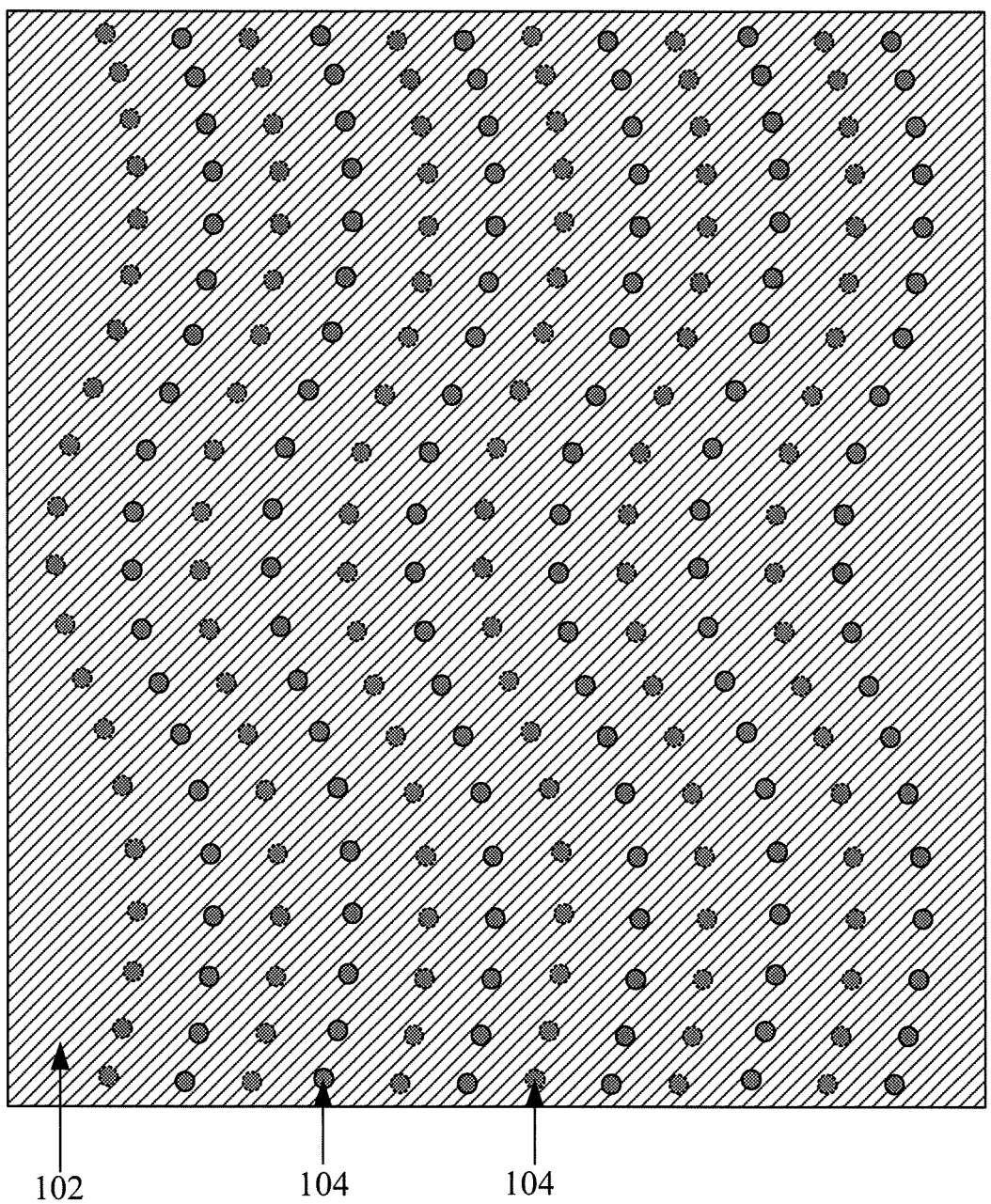
FIG. 6 is a front view of yet another encapsulation structure in accordance with an embodiment of the present disclosure.
Figure 7:
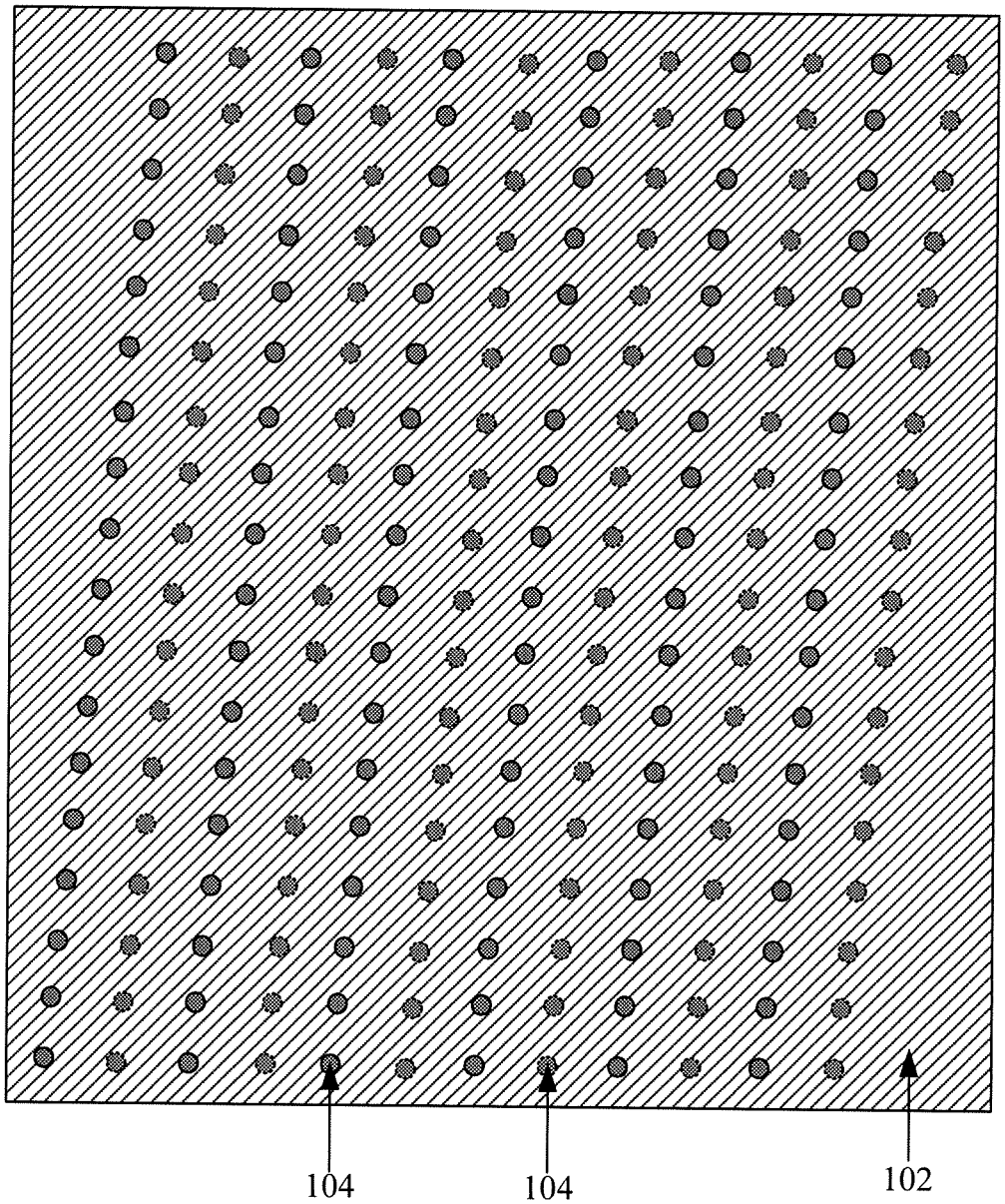
FIG. 7 is a front view of yet another encapsulation structure in accordance with an embodiment of the present disclosure.

Exemplarily, please refer to FIG. 6 and FIG. 7, which are front views of other two encapsulation structures 10 in accordance with embodiments of the present disclosure. In FIGS. 6 and 7, the opening indicated by the dotted line is a first opening (namely, the opening in the first sub-inorganic layer 101), and the opening indicated by the solid line is a second opening (namely, the opening in the second sub-inorganic layer 102). For explanation, FIGS. 6 and 7 take that the first opening and the second opening are both circular holes as an example, FIG. 6 takes that the first opening and the second opening are both arranged into curves as an example, and FIG. 7 takes that the first opening and the second opening are both arranged into straight lines as an example. As shown in FIG. 6, a plurality of first openings are formed in the first sub-inorganic layer (not shown in FIG. 6) of the second encapsulation structure layer and an elastic structure 104 is disposed in each first opening. The plurality of first openings are arranged into a plurality of curves extending in parallel directions. A plurality of second openings are formed in the second sub-inorganic layer 102 of the second encapsulation structure layer and an elastic structure 104 is disposed in each second opening. The plurality of second openings are arranged into a plurality of curves extending in parallel directions. The curves formed by the first openings and the curves formed by the second openings extend in parallel directions. As shown in FIG. 7, a plurality of first openings are formed in the first sub-inorganic layer (not shown in FIG. 7) of the second encapsulation structure layer and an elastic structure 104 is disposed in each first opening. The plurality of first openings are arranged into a plurality of straight lines that are parallel to one another. A plurality of second openings are formed in the second sub-inorganic layer 102 of the second encapsulation structure layer and an elastic structure 104 is disposed in each second opening. The plurality of second openings are arranged into a plurality of straight lines that are parallel to one another. Optionally, the straight lines formed by the first openings and the straight lines formed by the second openings are parallel to each other.

Those skilled in the art can easily understand that FIG. 4 to FIG. 7 are described by taking that all the openings in the same encapsulation structure are in the same shape as an example. The openings in the same encapsulation structure may also be in different shapes. For example, in an encapsulation structure, the first openings may be slits, and the second openings may be holes; or, the first openings may include both holes and slits, and the second openings may include both holes and slits; or, the first openings may include curved slits and linear slits, and the second openings include circular holes, square holes, etc., which will not be limited in the embodiments of the present disclosure. Optionally, the first and second openings may extend in parallel or un-parallel directions when the first and second openings are both curved, and the first and second openings may be parallel or not when the first and second openings are linear, which will not be limited in the embodiments of the present disclosure.

Those skilled in the art can easily understand that in the encapsulation structure provided by the embodiments of the present disclosure, the elastic structures are disposed in the openings formed in the inorganic layer, that is, the inorganic layer is doped with an elastic material. Therefore, alternatively, an inorganic material and the elastic material can be mixed, and the inorganic layer is prepared from a mixed material, such that the inorganic layer has certain stretchability and bending resistance, which is not repeated in the embodiments of the present disclosure.

In summary, in the encapsulation structure provided by the embodiments of the present disclosure, at least one encapsulation structure layer includes the inorganic layer and the organic layer that are superimposed. The inorganic layer comprises a first sub-inorganic layer and a second sub-inorganic layer that are superimposed, a first opening is in the first sub-inorganic layer, a second opening is in the second sub-inorganic layer, and an elastic structure is disposed in each of the first opening and the second opening. Each elastic structure can improve the stretchability and the bending resistance of the inorganic layer in which the elastic structure is, and thus the stretchability and the bending resistance of the inorganic layers are improved, which is helpful to improve the stretchability and the bending resistance of the encapsulation structure.

The encapsulation structure provided by the embodiments of the present disclosure may be applied to the following methods. For the encapsulation methods provided by the embodiments of the present disclosure, reference may be made to the description in the following embodiments.

An embodiment of the present disclosure provides an encapsulation method which may be used to encapsulate a device to be encapsulated, to form the encapsulation structure 10 as shown in any one of FIGS. 1 to 7. The encapsulation method includes:

forming, on an outer side of a device to be encapsulated, at least two encapsulation structure layers that cover the device to be encapsulated. At least one of the at least two encapsulation structure layers includes an inorganic layer and an organic layer that are superimposed. The inorganic layer comprises a first sub-inorganic layer and a second sub-inorganic layer that are superimposed, a first opening is in the first sub-inorganic layer, a second opening is in the second sub-inorganic layer, and an elastic structure is disposed in each of the first opening and the second opening, In summary, according to the encapsulation method provided by the embodiments of the present disclosure, at least one encapsulation structure layer includes the inorganic layer and the organic layer that are superimposed. The inorganic layer comprises a first sub-inorganic layer and a second sub-inorganic layer that are superimposed, a first opening is in the first sub-inorganic layer, a second opening is in the second sub-inorganic layer, and an elastic structure is disposed in each of the first opening and the second opening. Each elastic structure can improve the stretchability and the bending resistance of the inorganic layer in which the elastic structure is, and thus the stretchability and the bending resistance of the inorganic layers are improved, which is helpful to improve the stretchability and the bending resistance of the encapsulation structure.

Optionally, forming, on the outer side of the device to be encapsulated, the at least two encapsulation structure layers that cover the device to be encapsulated includes:

forming, on the outer side of the device to be encapsulated, an inorganic layer that covers the device to be encapsulated, wherein the inorganic layer includes a first sub-inorganic layer and a second sub-inorganic layer that are superimposed; a first opening is formed in the first sub-inorganic layer; a second opening is formed in the second sub-inorganic layer; an orthographic projection of the second opening on the first sub-inorganic layer and the first opening are staggered; and an elastic structure is disposed in each of the first opening and the second opening; and forming an organic layer on an outer side of the inorganic layer to obtain a first encapsulation structure layer.

Optionally, forming, on the outer side of the device to be encapsulated, the at least two encapsulation structure layers that cover the device to be encapsulated further includes:

forming, on an outer side of the first encapsulation structure layer, an inorganic layer that covers the first encapsulation structure layer to obtain a second encapsulation structure layer, wherein the inorganic layer includes a first sub-inorganic layer and a second sub-inorganic layer that are superimposed; a first opening is formed in the first sub-inorganic layer; a second opening is formed in the second sub-inorganic layer; an orthographic projection of the second opening on the first sub-inorganic layer and the first opening are staggered; and an elastic structure is disposed in each of the first opening and the second opening.

Optionally, forming, on the outer side of the device to be encapsulated, the inorganic layer that covers the device to be encapsulated includes:

forming, on the outer side of the device to be encapsulated, a first sub-inorganic layer that covers the device to be encapsulated;

forming a first opening in the first sub-inorganic layer;

forming an elastic structure in the first opening;

forming, on an outer side of the first sub-inorganic layer, a second sub-inorganic layer that covers the first sub-inorganic layer;

forming a second opening in the second sub-inorganic layer; and forming an elastic structure in the second opening.

Optionally, the device to be encapsulated is located in a display area of a base substrate. The base substrate is also provided with a non-display area. The method further includes:

forming a barrier wall in the non-display area, wherein all the inorganic layers of the encapsulation structure cover the barrier wall.

All the optional technical solutions described above may be combined in any way to form optional embodiments of the present disclosure, which is not repeated one by one herein.

Figure 8:
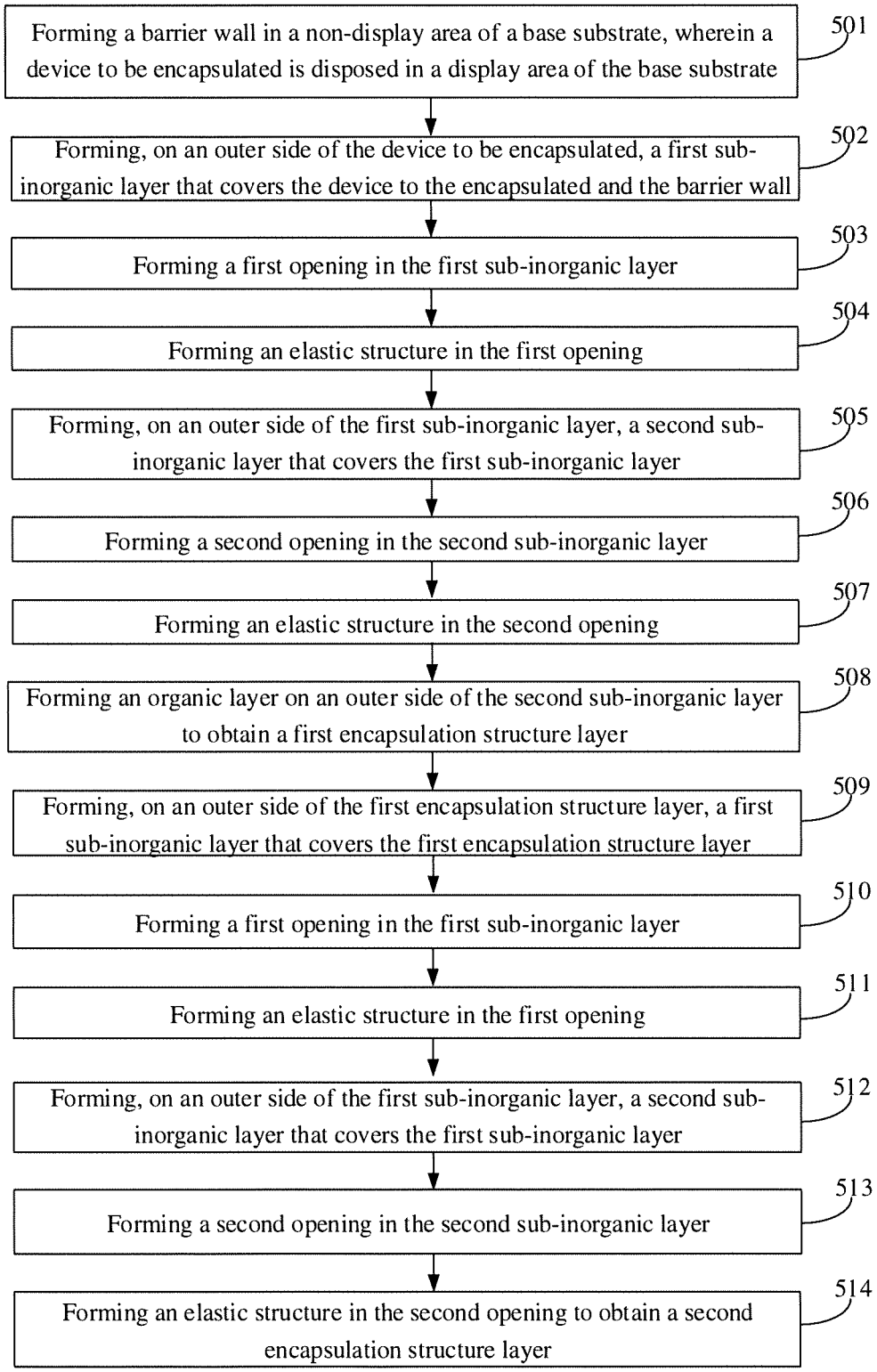
FIG. 8 is a flow chart of an encapsulation method in accordance with an embodiment of the present disclosure.

Please refer to FIG. 8, which is a flow chart of an encapsulation method in accordance with an embodiment of the present disclosure. The encapsulation method can be used to encapsulate a device to be encapsulated to form the encapsulation structure 10 shown in any of FIGS. 1 to 7. This embodiment is described by taking formation of the encapsulation structure shown in FIG. 2 as an example. Referring to FIG. 8, the method may include the following steps.

In step 501, a barrier wall is formed in a non-display area of a base substrate. A device to be encapsulated is disposed in a display area of the base substrate.

Figure 9:
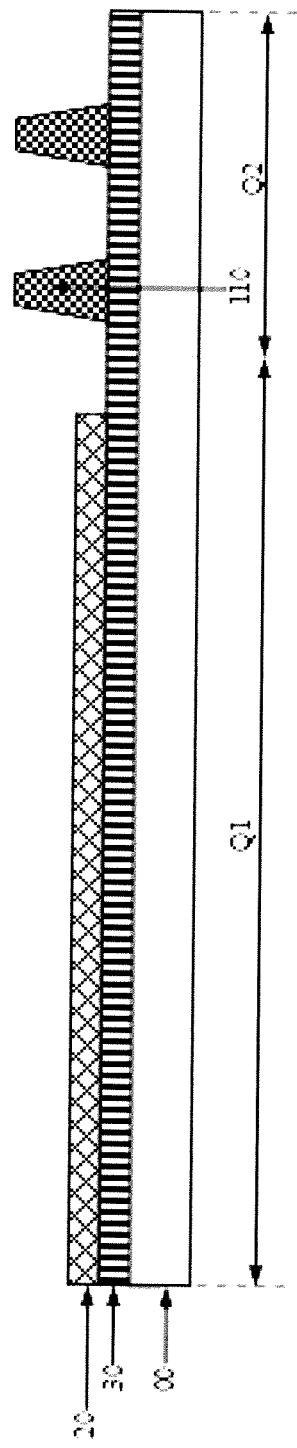
FIG. 9 is a schematic diagram provided after forming a barrier wall on a base substrate in accordance with an embodiment of the present disclosure.

Please refer to FIG. 9, which is a schematic diagram after forming a barrier wall 110 in the non-display area Q2 of a base substrate 00 in accordance with an embodiment of the present disclosure. The base substrate 00 is provided with a display area. Q1 and a non-display area Q2. The non-display area Q2 usually surrounds the display area Q1. A TFT layer 30 is disposed on the base substrate 00. A device to be encapsulated 20 and the barrier wall 110 are both disposed on the TFT layer 30. The barrier wall 110 may be made from an organic material, and the number and widths of the barrier walls 110 may be determined according to the width of the non-display area Q2 of the base substrate 00. For example, the number of the barrier walls 110 is two.

Optionally, an organic material layer may be formed on the TFT layer 30 by any one of the methods including coating, magnetron sputtering, thermal evaporation, and plasma enhanced chemical vapor deposition (PECVD) and then processed by a one-time patterning process to obtain the barrier wall 110. Alternatively, the barrier wall 110 may be formed on the TFT layer 03 in the non-display area Q2 by an ink-jet printing process or a screen printing process.

In step 502, a first sub-inorganic layer that covers the device to be encapsulated and the barrier wall is formed on an outer side of the device to be encapsulated.

Figure 10:
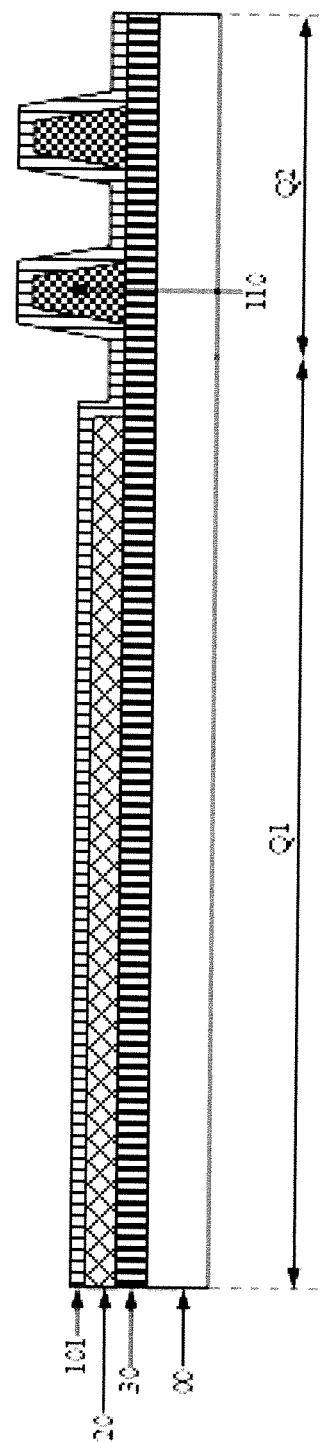
FIG. 10 is a schematic diagram provided after forming a first sub-inorganic layer on an outer side of a device to be encapsulated in accordance with an embodiment of the present disclosure.

Please refer to FIG. 10, which is a schematic diagram after forming, on the outer side of the device to be encapsulated 20, a first sub-inorganic layer 101 that covers the device to be encapsulated 20 and the barrier wall 110 in accordance with an embodiment of the present disclosure. The first sub-inorganic layer 101 covers the base substrate 00, may be made from at least one of the following materials: SiON, SiNx, $SiO_2$, $Al_2O_3$, ZnO and $TiO_2$, and may have a thickness ranging about from 0.2 µm to 0.7 µm.

Exemplarily, one layer of SiON may be deposited on the base substrate 00, on which the device to be encapsulated 20 and the barrier wall 110 are formed, by any one of the methods including coating, magnetron sputtering, thermal evaporation, PECVD and thin film encapsulation (TFE) as the first sub-inorganic layer 101.

In step 503, a first opening is formed in the first sub-inorganic layer.

Figure 11:
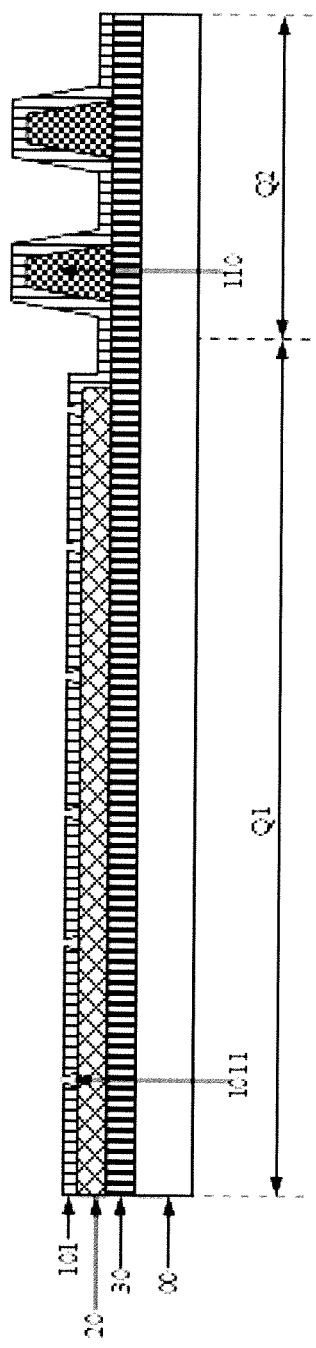
FIG. 11 is a schematic diagram provided after forming a first opening in a first sub-inorganic layer in accordance with an embodiment of the present disclosure.

Please refer to FIG. 11, which is a schematic diagram after forming a first opening 1011 in the first sub-inorganic layer 101 in accordance with an embodiment of the present disclosure. A plurality of first openings 1011 are formed in the first sub-inorganic layer 101, and an orthographic projection of each first opening 1011 on the base substrate 00 may be located in the display area Q1 of the base substrate 00. The first openings 1011 may be holes or slits, and the holes may be blind holes or through holes. Optionally, the first openings 1011 may be slits, and may extend in parallel directions. The first openings 1011 may be curved; or, the first openings 1011 may be linear. In addition, there is an angle between the first opening 1011 and the boundary of the first sub-inorganic layer 101, and the angle is generally less than or equal to 90°.

Optionally, the first sub-inorganic layer 101 may be processed by a one-time patterning process to form the first opening 1011 in the first sub-inorganic layer 101; or, the first opening may be formed in the first sub-inorganic layer 101 by a transfer printing process. The one-time patterning process may include photoresist coating, exposure, developing, etching and photoresist stripping. Therefore, processing the first sub-inorganic layer 101 by the one-time patterning process may include: first, coating the first sub-inorganic layer 101 with a layer of photoresist to obtain a photoresist layer; performing exposure on the photoresist layer by a mask to form a fully-exposed area and a non-exposed area on the photoresist layer; after that, processing the exposed photoresist layer through a developing process to remove the photoresist in the fully-exposed area and to retain the photoresist in the non-exposed area; then, etching an area, corresponding to the fully-exposed area, on the first sub-inorganic layer 101 to form a first opening 1011 in the first sub-inorganic layer 101; and finally, stripping the photoresist in the non-exposed area. It is easy to understand that the present embodiment is described by taking that positive photoresist is used to form the first opening 1011 as an example. Negative photoresist may also be used to form the first opening 1011, which will not be repeated in the embodiments of the present disclosure.

In step 504, an elastic structure is formed in the first opening.

Figure 12:
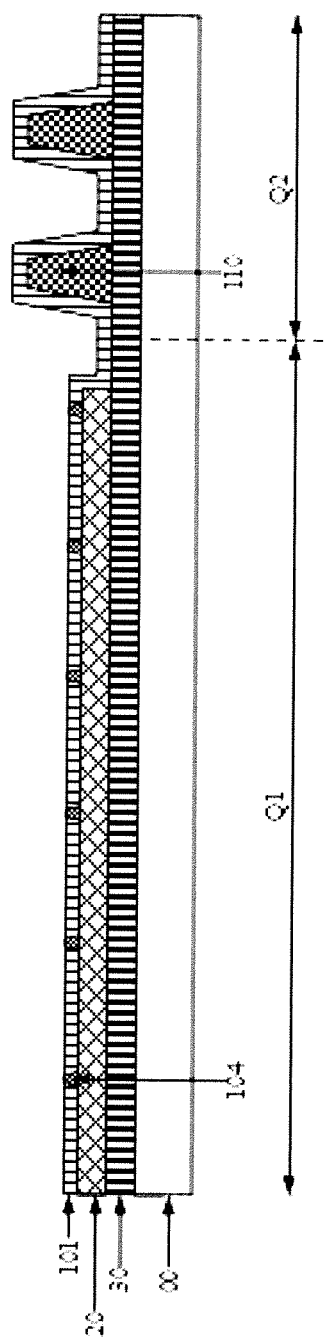
FIG. 12 is a schematic diagram provided after an elastic structure is formed in a first opening in accordance with an embodiment of the present disclosure.

Please refer to FIG. 12, which is a schematic diagram after forming an elastic structure 104 in the first opening 1011 in accordance with an embodiment of the present disclosure. The shape of the elastic structure 104 in each first opening 1011 matches that of the first opening 1011. The elastic structure 104 may be made from at least one of the following materials: polyimide, polyurethane, polypropylene, PMDS, polyurethane, PPS, HMDSO, TMS and silica gel, or the elastic structure 104 may be made from other organosilicon compound materials. Optionally, the first opening 1011 may be filled with an elastic material by an inkjet printing process or a screen printing process, and the filling elastic material may be cured to form the elastic structure 104 in the first opening 1011.

It is easy to understand that the above steps 502 to 504 take that the first sub-inorganic layer 101 is formed first, then the first opening 1011 is formed in the first sub-inorganic layer 101, and finally the elastic structure 104 is formed in the first opening 1011 as an example for illustration. As an alternative to the above steps 502 to 504, the elastic structure 104 may be formed on the base substrate 00, on which the barrier wall 110 is formed, by an ink-jet printing process or a screen printing process, and then the first sub-inorganic layer 101 is formed, which can achieve the same effect as the above steps 502 to 504 and will not be limited in the embodiments of the present disclosure.

In step 505, a second sub-inorganic layer that covers the first sub-inorganic layer is formed on an outer side of the first sub-inorganic layer.

Figure 13:
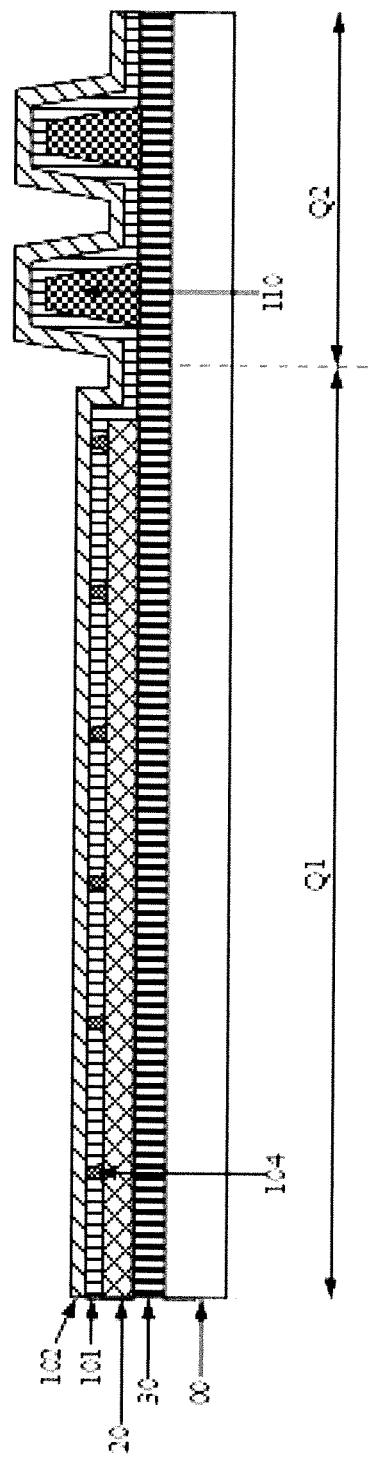
FIG. 13 is a schematic diagram provided after forming a second sub-inorganic layer on an outer side of a first sub-inorganic layer in accordance with an embodiment of the present disclosure.

Please refer to FIG. 13, which is a schematic diagram after forming, on the outer side of the first sub-inorganic layer 101, a second sub-inorganic layer 102 that covers the first sub-inorganic layer 101 in accordance with an embodiment of the present disclosure. The second sub-inorganic layer 102 covers the base substrate 00 and may be made from at least one of the following materials: SiON, SiNx, $SiO_2$, $Al_2O_3$, ZnO and $TiO_2$. The second sub-inorganic layer 102 and the first sub-inorganic layer 101 may be made from the same or different materials. The second sub-inorganic layer 102 may have a thickness ranging about from 0.2 µm to 0.7 µm.

Exemplarily, a layer of SiNx may be deposited on the base substrate 00, on which the first sub-inorganic layer 101 is formed, by any one of the methods including coating, magnetron sputtering, thermal evaporation, PECVD and TFE CVD to serve as the second sub-inorganic layer 102.

In step 506, a second opening is formed in the second sub-inorganic layer.

Figure 14:
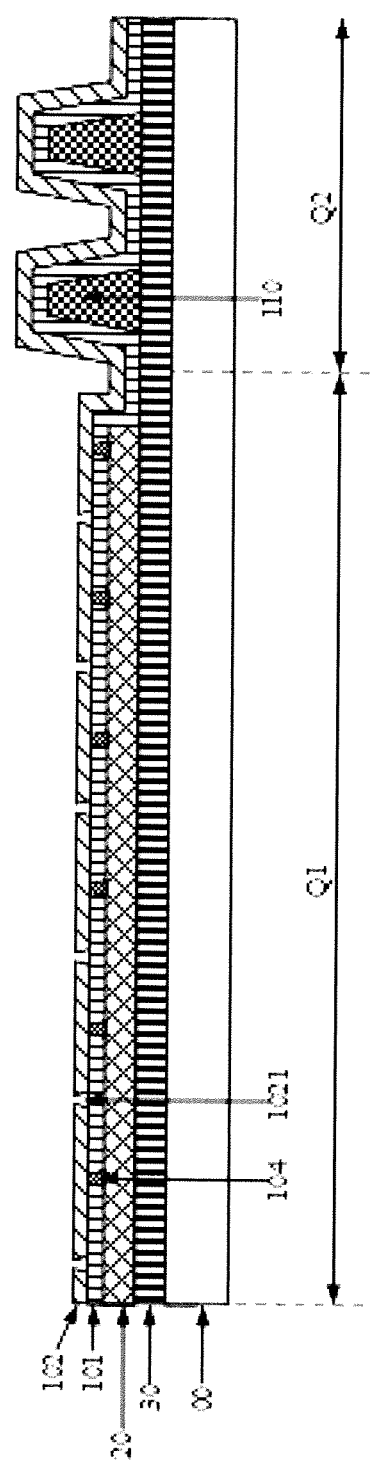
FIG. 14 is a schematic diagram provided after forming a second opening in a second sub-inorganic layer in accordance with an embodiment of the present disclosure.

Please refer to FIG. 14, which is a schematic diagram after forming a second opening 1021 in the second sub-inorganic layer 102 in accordance with an embodiment of the present disclosure. A plurality of second openings 1021 are formed in the second sub-inorganic layer 102. An orthographic projection of each second opening 1021 on the base substrate 00 may be located in the display area Q1 of the base substrate 00. An orthographic projection of each second opening 1021 on the first sub-inorganic layer 101 and the first opening 1011 are staggered. The second openings 1021 may be holes or slits, and the holes may be blind holes or through holes. Optionally, the second openings 1021 may be slits, and may extend in parallel directions. The second openings 1021 may be curved; or the second openings 1021 may be linear. In addition, there is an angle between the second opening 1021 and the boundary of the second sub-inorganic layer 102, and the angle is usually less than or equal to 90°. Reference may be made to the foregoing step 503 for implementation of step 506, which is not repeated in the embodiments of the present disclosure.

In step 507, an elastic structure is formed in the second opening.

Figure 15:
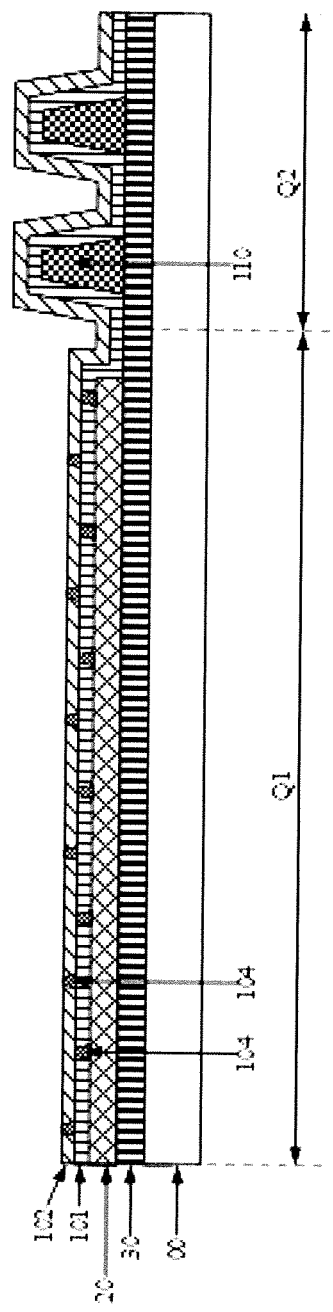
FIG. 15 is a schematic diagram provided after forming an elastic structure in a second opening in accordance with an embodiment of the present disclosure.

Please refer to FIG. 15, which is a schematic diagram after forming an elastic structure 104 in the second opening 1021 in accordance with an embodiment of the present disclosure. The shape of the elastic structure 104 in each second opening 1021 matches that of the second opening 1021. Reference may be made to the above step 504 for implementation of step 507, which is not repeated in the embodiments of the present disclosure.

In step 508, an organic layer is formed on an outer side of the second sub-inorganic layer to obtain a first encapsulation structure layer.

Figure 16:
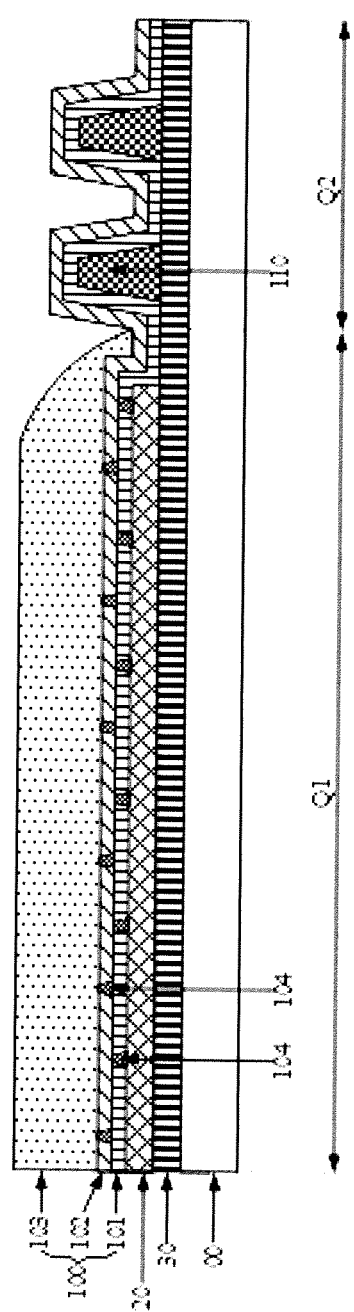
FIG. 16 is a schematic diagram provided after forming an organic layer on an outer side of a second sub-inorganic layer.

Please refer to FIG. 16, which is a schematic diagram after forming an organic layer 103 on the outer side of the second sub-inorganic layer 102 in accordance with an embodiment of the present disclosure. An orthographic projection of the organic layer 103 on the base substrate 00 is located in the display area Q1 of base substrate 00. The organic layer 103 may be made from at least one of the following materials: PI, PU and polypropylene, Exemplarily, the PI layer may be formed on the outer side of the second sub-inorganic layer 102 by any one of the methods including coating, magnetron sputtering, thermal evaporation, PECVD and TFE CVD, and then processed by a one-time patterning process to obtain the organic layer 103. Alternatively, the second sub-inorganic layer 102 in the display area Q1 may be coated with PI by an ink-jet printing process or a coating process to serve as the organic layer 103. After the above steps 502 to 508, the first encapsulation structure layer 100 is obtained.

In the embodiments of the present disclosure, the organic layer 103 and the elastic structure 104 may be made from the same or different materials. The above steps 507 and 508 may be combined when the organic layer 103 and the elastic structure 104 are made from the same material. That is, the organic layer 103 is directly formed on the outer side of the second sub-inorganic layer 102 after the second opening 1021 is formed in the second sub-inorganic layer 102, and during the formation of the organic layer 103, the second opening 1021 is filled with the material of the organic layer to form the elastic structure 104 in the second opening 1021.

Figure 17:
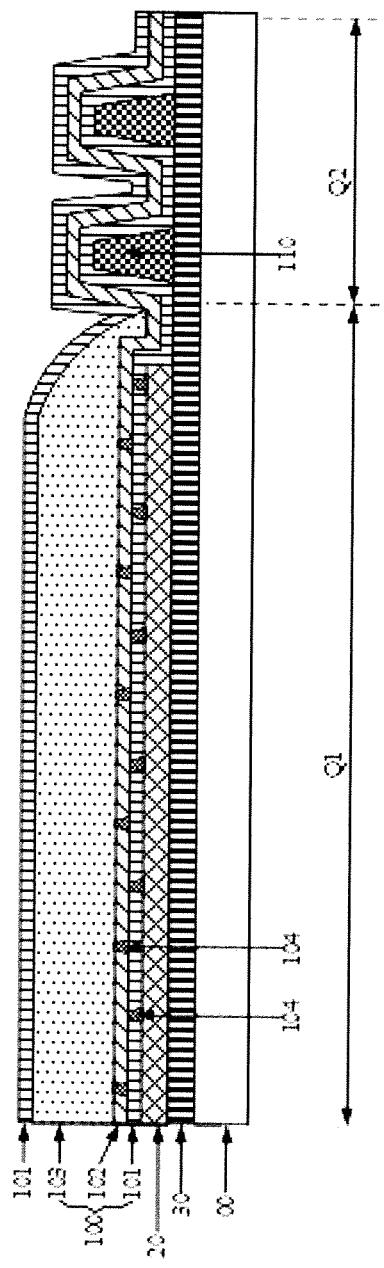
FIG. 17 is a schematic diagram provided after forming a first sub-inorganic layer on an outer side of a first encapsulation structure layer in accordance with an embodiment of the present disclosure.

In step 509, a first sub-inorganic layer that covers the first encapsulation structure layer is formed on an outer side of the first encapsulation structure layer. FIG. 17 is a schematic diagram after forming, on the outer side of the first encapsulation structure layer, a first sub-inorganic layer 101 that covers the first encapsulation structure layer.

Figure 18:
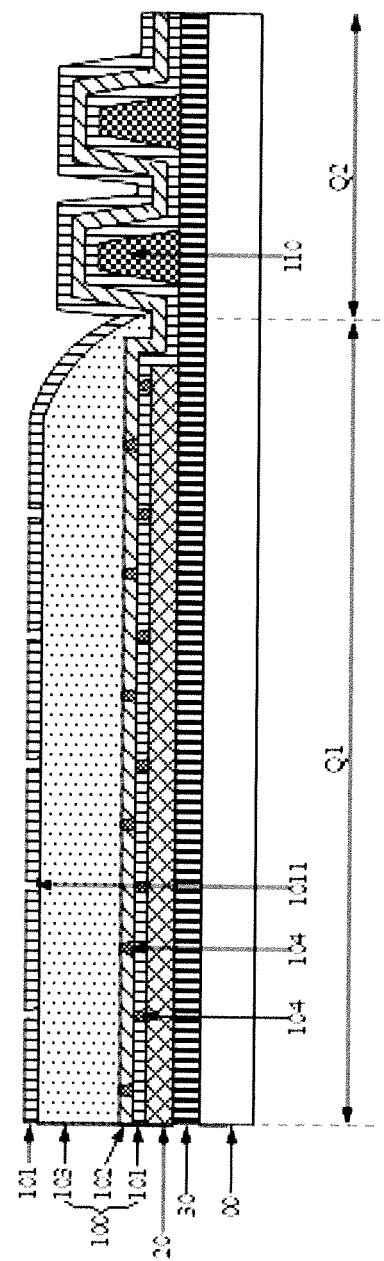
FIG. 18 is a schematic diagram provided after forming a first opening in a first sub-inorganic layer in accordance with an embodiment of the present disclosure.

In step 510, a first opening is formed in the first sub-inorganic layer. FIG. 18 is a schematic diagram provided after forming the first opening 1011 in the first sub-inorganic layer 101.

Figure 19:
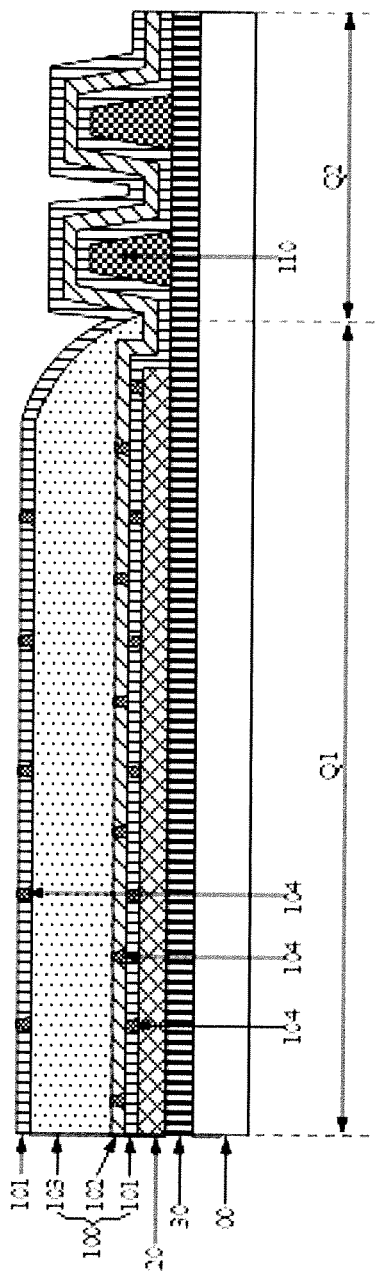
FIG. 19 is a schematic diagram provided after forming an elastic structure in a first opening in accordance with an embodiment of the present disclosure.

In step 511, an elastic structure is formed in the first opening. FIG. 19 is a schematic diagram provided after forming the elastic structure 104 in the first opening 1011.

For implementation of the above steps 509 to 511, reference may be made to steps 502 to 504 in the present embodiment. Alternatively, in the embodiments of the present disclosure, as an alternative to the steps 509 to 511, transfer printing may be performed on the organic layer 103 after execution of step 508 to form the elastic structure 104 on the organic layer 103, then the first sub-inorganic layer 101 is formed on the side, away from the base substrate 101, of the organic layer 103 by means of deposition. The first opening is formed in the first sub-inorganic layer 101, and the elastic structure 104 on the organic layer 103 is located in the first opening.

Figure 20:
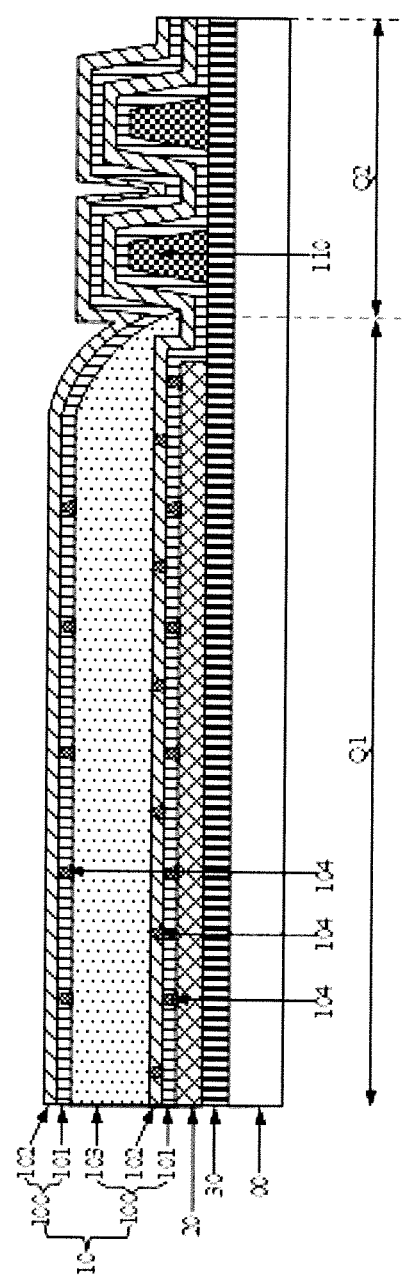
FIG. 20 is a schematic diagram provided after forming a second sub-inorganic layer on an outer side of a first sub-inorganic layer in accordance with an embodiment of the present disclosure.

In step 512, a second sub-inorganic layer that covers the first sub-inorganic layer is formed on the outer side of the first sub-inorganic layer. FIG. 20 is a schematic diagram provided after forming, on the outer side of the first sub-inorganic layer 101, the second sub-inorganic layer 102 that covers the first sub-inorganic layer 101.

Figure 21:
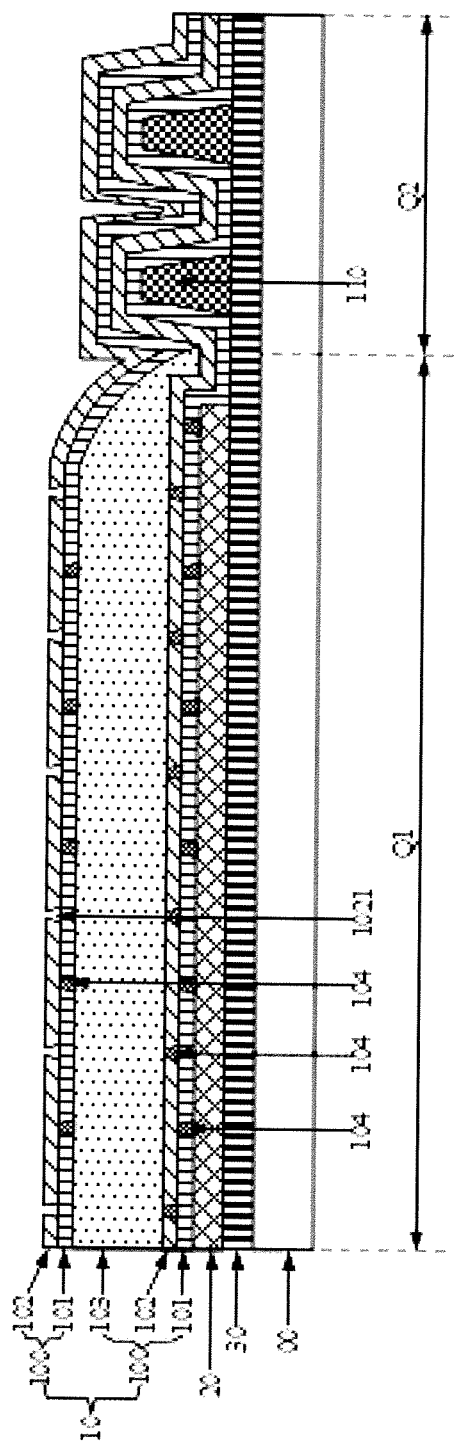
FIG. 21 is a schematic diagram provided after forming a second opening in a second sub-inorganic layer in accordance with an embodiment of the present disclosure.

In step 513, a second opening is formed in the second sub-inorganic layer. FIG. 21 is a schematic diagram provided after forming the second opening 1021 in the second sub-inorganic layer 102.

In step 514, an elastic structure is formed in the second opening to obtain a second encapsulation structure layer. FIG. 2 is a schematic diagram provided after filling the second opening 1021 with the elastic structure 104.

Reference may be made to steps 505 to 507 for implementation of steps 512 to 514 which will not be repeated in the embodiments of the present disclosure.

In summary, in the encapsulation method provided by the present embodiment, in the encapsulation structure, at least one encapsulation structure layer includes the inorganic layer and the organic layer that are superimposed. The inorganic layer comprises a first sub-inorganic layer and a second sub-inorganic layer that are superimposed, a first opening is in the first sub-inorganic layer, a second opening is in the second sub-inorganic layer, and an elastic structure is disposed in each of the first opening and the second opening. Each elastic structure can improve the stretchability and the bending resistance of the inorganic layer in which the elastic structure is, and thus the stretchability and the bending resistance of the inorganic layers are improved, which is helpful to improve the stretchability and the bending resistance of the encapsulation structure.

Based on the same inventive concept, an embodiment of the present disclosure further provides a display apparatus. The display apparatus includes a display device and an encapsulation structure located on an outer side of the display device. The encapsulation structure may be the encapsulation structure 10 provided in the foregoing embodiments. The display device may be an OLED device or a QLED device, and the display apparatus may be a flexible display apparatus. The display apparatus may be a mobile terminal such as a mobile phone or a tablet computer, or the display apparatus may be such wearable equipment as a watch or a bracelet, or the display apparatus may be any product or component having a display function, such as a television, a display, a notebook computer, a digital photo frame or a navigator.

In the present disclosure, the terms "first" and "second" are merely used to describe but not denote or imply any relative importance. The term "a plurality of" refers to two or more, and the term "at least one" means one or more, unless otherwise explicitly provided. The term "and/or" in the present disclosure is merely used to describe corresponding relations among associated objects, and may indicate existence of three relationships. For example, "at least one of A and B" may indicate three relationships that A exists alone, A and B exist simultaneously, and B exists alone. Likewise, "at least one of A, B and C" may indicate seven relationships that A exists alone, B exists alone, C exists alone, A and B exist simultaneously, A and C exist simultaneously, C and B exist simultaneously, and A, B and C exist simultaneously. Similarly, "at least one of A, B, C and D" may indicate fifteen relationships that A exists alone, B exists alone. C exists alone, D exists alone, A and B exist simultaneously, A and C exist simultaneously, A and D exist simultaneously, C and B exist simultaneously, D and B exist simultaneously, C and D exist simultaneously, A, B and C exist simultaneously, A, B and D exist simultaneously, A, C and D exist simultaneously, B, C and D exist simultaneously and A, B, C and D exist simultaneously.

The serial numbers of the foregoing embodiments of the present disclosure are merely for description, and do not represent the priority of the embodiments.

Persons of ordinary skill in the art can understand that all or part of the steps described in the above embodiments can be completed through hardware, or through relevant hardware instructed by applications stored in a non-transitory computer readable storage medium, such as a read-only memory, a disk or a CD, etc.

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. An encapsulation method, comprising:
   forming, on an outer side of a device to be encapsulated, at least two encapsulation structure layers that cover the device to be encapsulated
   wherein forming, on the outer side of the device to be encapsulated, the at least two encapsulation structure layers that cover the device to be encapsulated comprises:
   forming, on the outer side of the device to be encapsulated, a first inorganic layer that covers the device to be encapsulated, wherein the first inorganic layer comprises a first sub-inorganic layer and a second sub-inorganic layer that are superimposed, a first opening is in the first sub-inorganic layer, a second opening is in the second sub-inorganic layer, an orthographic projection of the second opening on the first sub-inorganic layer and the first opening are staggered, and an elastic structure is disposed in each of the first opening and the second opening; and
   forming a first organic layer on an outer side of the first inorganic layer to obtain a first encapsulation structure layer.

2. The method according to claim 1, wherein
   forming, on the outer side of the device to be encapsulated, the first inorganic layer that covers the device to be encapsulated comprises:
   forming, on the outer side of the device to be encapsulated, a first sub-inorganic layer that covers the device to be encapsulated;
   forming a first opening in the first sub-inorganic layer;
   forming an elastic structure in the first opening;
   forming, on an outer side of the first sub-inorganic layer, a second sub-inorganic layer that covers the first sub-inorganic layer;
   forming a second opening in the second sub-inorganic layer; and
   forming an elastic structure in the second opening.

3. The method according to claim 1, wherein
   forming, on the outer side of the device to be encapsulated, the at least two encapsulation structure layers that cover the device to be encapsulated further comprises:
   forming, on an outer side of the first encapsulation structure layer, an second inorganic layer that covers the first encapsulation structure layer to obtain a second encapsulation structure layer, wherein the second inorganic layer comprises a third sub-inorganic layer and a fourth sub-inorganic layer that are superimposed, a third opening is in the third sub-inorganic layer, a fourth opening is in the fourth sub-inorganic layer, an orthographic projection of the fourth opening on the third sub-inorganic layer and the third opening are staggered, and an elastic structure is disposed in each of the third opening and the fourth opening.

4. The method according to claim 3, wherein
   the device to be encapsulated is disposed in a display area of a base substrate, the base substrate is also provided with a non-display area, and the method further comprises:
   forming a barrier wall in the non-display area, wherein both of the first inorganic layer and the second inorganic layer cover the barrier wall.

* * * * *